United States Patent [19]

Yuura et al.

[11] Patent Number: 5,517,604
[45] Date of Patent: May 14, 1996

[54] DATA INPUT/OUTPUT PROCESS AND DESIGN SUPPORTING PROCESS

[75] Inventors: Katsuhiko Yuura, Kodaira; Hisashi Takahashi, Sagamihara, both of Japan

[73] Assignees: Hitachi, Ltd.; Hitachi VLSI Engineering Corporation, both of Tokyo, Japan

[21] Appl. No.: 852,768

[22] Filed: Mar. 17, 1992

[30] Foreign Application Priority Data

Mar. 20, 1991 [JP] Japan ........................... 3-056470
May 29, 1991 [JP] Japan ........................... 3-124350

[51] Int. Cl.⁶ ............................................. G06F 17/50
[52] U.S. Cl. ........................ 395/141; 395/155; 395/161
[58] Field of Search .................................... 395/155, 161, 395/164, 149, 141

[56] References Cited

U.S. PATENT DOCUMENTS

| | | | |
|---|---|---|---|
| 4,656,603 | 4/1987 | Dunn | 395/161 X |
| 4,962,472 | 10/1990 | Seki et al. | 395/161 |
| 5,019,961 | 5/1991 | Addesso et al. | 395/161 X |
| 5,247,610 | 9/1993 | Oshima et al. | 395/161 X |
| 5,255,363 | 10/1993 | Seyler | 395/149 X |

OTHER PUBLICATIONS

Abe, Noriyuki, et al. "A Study of Switching Service Modeling System," SSE 90–114 of Electronic Information Communication Institute, 1991, pp. 1–6. (Japanese—English Abstract).

Maejima, Yukihito, et al. "Object–Oriented Description of Exchange Service Specification," Japanese paper in the Second NA Workshop of the Institute of Electronics Information and Communication Enginners, Apr.8, 1991, pp. C–2–1–C–2–4 (Japanese).

van der Meulen, Pieter S. "INSIST: Interactive Simulation in Smalltalk," ACM OOPSLA Proceedings, Oct. 4–8, 1987, pp. 366–376 (English).

Rekimoto, Junichi, et al. "Canae: A High–Level Software Platform for User–Interface Development Using Editor Parts," Information Processing Society, vol. 31, No. 5, May 1990, pp. 602–611 (Japanese).

Shu (Visual Programming, ©1988 by van Nostrand Reinhold Company Inc.), pp.190–239.

*Primary Examiner*—Mark K. Zimmerman
*Assistant Examiner*—Cliff Nguyen Vo
*Attorney, Agent, or Firm*—Fay, Sharpe, Beall, Fagan, Minnich & McKee

[57] ABSTRACT

A process for architecting a figure input/output interface of an instance is provided in an object-oriented design supporting system or the like. An applicable graphic editor is provided with a figure editor, which expands a function for defining a method to draw a user figure and also a function for defining a slot of a figure attribute when the user figure is designated; and furthermore expands a function to produce an instance when the user figure is drawn and also a function for coupling the instances when the figures are connected with each other. Then, input/output figures of a design component are defined and inputted with employment of this applicable graphic editor. In the output, a slot of the displayed instance is updated and then a display is deformed. As a result, the formation of the figure input/output for the instance such as the design component is available by only operating the screen of the applicable graphic editor. According to another aspect, a user figure corresponding to a class is formed by operating a screen of a figure editor, whereby a connection point and a slot of a figure attribute is designated. As a result, a program for inputting/outputting a figure, coupling the figures and deforming the displayed figure is automatically produced, so that it is possible to input a figure of an instance, couple the instances by the figure connections and to realize an animation description by updating the slot of the instance.

5 Claims, 23 Drawing Sheets

FIG. 5

```
(defclass and gate       ()
   ((status  :initform   ())
    (inputs  :initform   ())
    (outputs :initform   ())
```
301

```
(defmethod apply a voltage ((obj  and  gate  ) vol)
    (with-slots (status outputs) obj
       (cond ((status
               (dolist (out outputs)
                  (funcall #' apply a voltage  out
                      (logand  status vol))
                  (setf status ())))
             (t (setf status vol)))))
```
302

CLASS DEFINITION <AND GATE> — 121

SLOT DEFINITION GROUP

| status | initform ( ) | 401 |
|---|---|---|
| inputs | initform ( ) | 402 |
| outputs | initform ( ) | 403 |
| ignition sign | initform 'narrow line | 404 |
| x-position | initform 0 | 405 |
| y-position | initform 0 | 406 |
| graphic | :allocation class<br>:initform<br>#'(lambda (obj px py)<br>  (with-slots (ignition sign) obj<br>    (progn ( line drawing :x(+0px):y(+10py):dx10:dy0)<br>           ( line drawing :x(+0px):y(+30py):dx10:dy0)<br>           (arc drawing : x(+10px):y(+20py):r 10<br>             :s-90 :e 90 :width ignition sign )<br>           (line drawing : x(+30px):y(+20py):dx10:dy<br>             0) ))) | 407 |

METHOD GROUP

| apply a voltage | ((obj and gate) vol)<br>  (with slots status outputs) obj   ) | 408 |
|---|---|---|
| presentation | ((obj and gate) x y )<br>  (with-slots(graphic x-position y-position) obj<br>    (setf x-position x y-position y )<br>    (funcall graphic  obj x y ))) | 409 |
| update<br>ignition sign | ((obj and gate ) value<br>   procedure to update ignition slot value  ) | 410 |
| update<br>ignition sign<br>:after | ((obj and gate) value )<br>  (with-slots(graphic x-position y-position) obj<br>    (funcall graphic obj x-position y-position))) | 411 |

FIG. 11A

INSTANCE 181

| ince 1 | | |
|---|---|---|
| class | and gate | ~911 |
| status | ( ) | ~912 |
| inputs | ( ) | ~913 |
| outputs | ( ) | ~914 |
| in-points | ((100)(300)) | ~915 |
| out-points | ((20 40)) | ~916 |
| ignition sign | narrow line | ~917 |
| x-position | 10 | ~918 |
| y-position | 20 | ~919 |
| graphic | #'( lambda ---- | ~920 |

| ince 1 | |
|---|---|
| class | and gate |
| status | ( ) |
| inputs | ( ) |
| outputs | (ince 2) |
| in-points | ((100)(300)) |
| out-points | ((20 40)) |
| ignition sign | narrow line |
| x-position | 10 |
| y-position | 20 |
| graphic | #'(lambda ---- |

914

123

| ince 2 | | |
|---|---|---|
| class | and gate | |
| status | ( ) | |
| inputs | (ince 1) | ~923 |
| outputs | ( ) | |
| in-points | ((100)(300)) | |
| out-points | ((20 40)) | |
| ignition sign | narrow line | |
| x-position | 10 | |
| y-position | 20 | |
| graphic | #'(lambda ---- | |

FIG. 17

| METHOD GROUP | | |
|---|---|---|
| APPLY A VOLTAGE | ((obj and gate ) vol )<br>(with slots (status outputs) obj ... ) | 1601 |
| PRESENTATION | ((obj and gate ) x y )<br>(with slots (graphic x-position y-position) obj<br>(setf x-position x y-position y)<br>(funcall graphic obj x y ))) | 1602 |
| CONNECTION | ((obj1 and gate) (obj2 connectable ) )<br>(with-slots (outputs out-points) obj1<br>(with-slots (inputs in-points) obj2<br>< procedure to select both endpoints from<br>out-points and in-points for connection ><br>(push obj2 outputs)<br>(push obj1 inputs )))) | 1603 |
| UPDATE IGNI-TION SIGN | (obj and gate ) value )<br><procedure to update ignition sign slot value> ) | 1604 |
| UPDATE IGNI-TION SIGN<br>:after | (obj and gate ) value )<br>(with-slots (graphic x-position y-position) obj<br>(funcall graphic obj x-position y-position))) | 1605 |

1512

DATA INPUT/OUTPUT PROCESS AND DESIGN SUPPORTING PROCESS

CROSS-REFERENCE TO RELATED APPLICATION

The present invention relates to an application U.S. Ser. No. 07/793590 filed Nov. 18, 1991, entitled "Equipment and Method for Displaying Specification of Behavior of Real Time System" by K. Maejima, T. Ohtsubo, M. Masui, N. Abe, K. Yuura and K. Mochizuk, now U.S. Pat. No. 5,335,339, assigned to one of the present assignees, the contents of which are incorporated herein by reference.

BACKGROUND OF THE INVENTION

The present invention relates to a production of an input/output program for data in a computer software, more particularly, an instance of an object-oriented language on a display screen. Also, the present invention relates to an architecture of a design supporting system containing an instance input/output.

In development of electronic apparatuses such as a computer, a support by software is necessarily required. In particular, it is important at investigating stages of a new model and also a new system that various constructive sketches of the apparatuses are inputted as models; a simulation is carried out; a simulation result is evaluated; and the above-described operations are repeated so as to reconsider a design policy. Also, it is important that the design policy is correctly transferred to relevant staff members with easy understandings.

An object-oriented language is to provide methodology for constituting software in which an "object" is used as a component, and owns a high applicability to a design matter. A basic element of an object-oriented language program is defined by a class. In a class definition, both a slot group as a variable of this class, and a method group corresponding to a procedure related to this class are defined. A concrete program element in accordance to this class definition is called as an "instance". There is provided a class corresponding to a sort of a component contained in an object to be designed, in which an attribute of this component and an element thereof are defined as a slot, whereas an effect of a component is defined as a method. Then, a model having various objects is archietected by combining the instances of the class, and then a simulation is performed by initiating the method.

To effectively utilize the above-described object-oriented type simulator, an improvement in the interface is expected when an instance is inputted and a result of a simulation is outputted. As to the input, it is important that the input is available in the interactive mode, and also both the component and entire model under input operation can be easily grasped. Accordingly, it is expected to enter an instance in a form of figure.

As to an output of the result, it is desirable to directly utilize the output of the instance to the display screen without any modification as the input in order that the simulator is repeatedly utilized thereby to progress the design and evaluation. On the other hand, it is required to develop the simulator at an earlier stage in development of the new mode and new system, and the above-described interface group must quickly accept variations in design objects and also investing ranges.

In view of easy representation of a function of a design model, not only a structure of this model is illustrated, but also an operation of a simulation is displayed by way of animation. Then, for instance, great expectations are made of means for dynamically deforming a graphic representation of the model.

In the conventional object-oriented design supporting method by inputting/outputting the figure of the instance and by inputting/outputting such a figure, into which concept of presentation has been introduced, it is required to greatly rewrite an input program when the input figure is modified in order that an input interface of the object-oriented application program is arbitrarily modified, depending upon the interactive situation and the contents to be inputted. Also, a cumbersome format change is required.

With respect to both the figure input/output of the instance, and also the object-oriented design support by the figure input/output, it is described in a literature SSE 90-114 of Electronic Information Communication Institute in 1991. In accordance with the above-described literature, the component function is defined as the class by the object-oriented language program, whereas the class for the component figure is defined. Thus, the figure indicative of the class of the component is transferred to the window for producing the model, thereby inputting the input. Upon formation of the model to be designed, the simulation is performed by sending the message to the instance of the component function, and then the message is transferred to the instance of the component figure so that the result thereof is displayed in the animation. However, there is no description in this literature, about the method for defining the class of the component figure, the method for architecting the model by coupling the instances with each other, and further the method for defining the method by the animation display.

Generally speaking, a description process by a program of an object-oriented language has been employed as a process for inputting a class definition and a method definition used to a definition on a coupling process of instances, and an animation representation.

On the other hand, with respect to the interface of the object-oriented application program, it is expected to arbitrarily change the interface, depending upon the interactive state and the contents to be inputted. In particular, it is required to prepare the definition on the design component within a short term in supporting of development of the new product and also the new system. Furthermore, to globally progress the design, the interface must be variable and must quickly accept variations in the design object and the investigation range.

To the contrary, if the method definition for defining the class of the component figure and the coupling method of the instances, and also used to the animation representation, is described by the program of the object-oriented language, it is not easy to set, change and expand the interface.

Other prior arts are described in, for instance, "Interactive Simulation in Smalltalk" by P. S. van der Meulen, ACM OOPSLA '87 proceedings, Oct. 4–8, 1987, pages 366 to 376. In this publication, there is shown an example such that as to the previously defined circuit component group, the figures of these circuit component group are drawn and the instances of the function are produced at the same time; these figures are connected with each other thereby to architect the model and perform the simulation. However, this paper does not describe such a scheme for giving the figures of these components, the drawing procedure, and the procedure of coupling the instances by the connections.

There is another publication "Kanae"; A High-Level Software Platform for User-Interface Development Using Editor Parts" by Rekimoto et al., Information Processing of Society, vol. 31, No. 5, pages 602 to 611 (May, 1990). The Rekimoto et al literature discloses a scheme for applying by the user the function to be called with regard to the mouse operation in the graphic editor. However, there is no description that the effects such as the slot reference and the method call to the instance corresponding to the figure are automatically allocated. As a consequence, a simulation representation of an operation specification in a real-time system cannot be realized.

SUMMARY OF THE INVENTION

An object of the present invention is to provide both a design supporting process and a design supporting system capable of reducing a load given to an interface program formation and having high expansibility with flexibility by automatically producing an interface program of an object-oriented application program from operations on a graphic editor.

Another object of the present invention is to provide a process for producing an object-oriented application program capable of reducing at least one of a load to form such a program for cutting out a relevant figure from figure data so as to produce an instance; a load to describe a presentation method; and a load to form a program for producing the instance by recognizing a connection from the graphic data.

A further object of the present invention is to provide a program simulation process capable of executing in an interactive mode on a display screen, an operative simulation of the produced object-oriented application program, and capable of easily detecting bugs in the produced program, and also of producing and investigating an animation program.

In a data processing process for supporting a design according to one aspect of the present invention, an input/output method is set in an interactive operation mode with employment of an applicable graphic editor in which a graphic editor has been expanded. In the applicable graphic editor, when an operator combines basic figures with each other thereby to define an arbitrary figure (user figure), the defined user figure is stored into a memory in relation to a class. When the user figure is drawn, a program for producing an instance of the corresponding class in accordance with this user figure is previously prepared. When the operator designates the connection point for the user figure, the drawn figures are connected by the connections based upon the above-described formed program, so that a method for automatically coupling the instances positioned at both ends by the pointer is generated. Furthermore, when a presentation slot used to define an attribute of a displayed figure (e.g., a length, a color, a pattern of a figure element, and a character series) is designated with regard to the user figure, a method is formed which deforms the displayed figure by updating the present value of the representation slot.

BRIEF DESCRIPTION OF THE DRAWINGS

FIG. 5 shows in detail a description of class definition program of FIG. 1;

FIG. 6 schematically indicates a detailed structure of the class definition of FIG. 5;

FIGS. 11A and 11B show in detail an instance of FIG. 4;

FIG. 17 schematically shows an example of a method unit for the class definition of FIG. 15;

DESCRIPTION OF THE PREFERRED EMBODIMENTS

Figure 1:
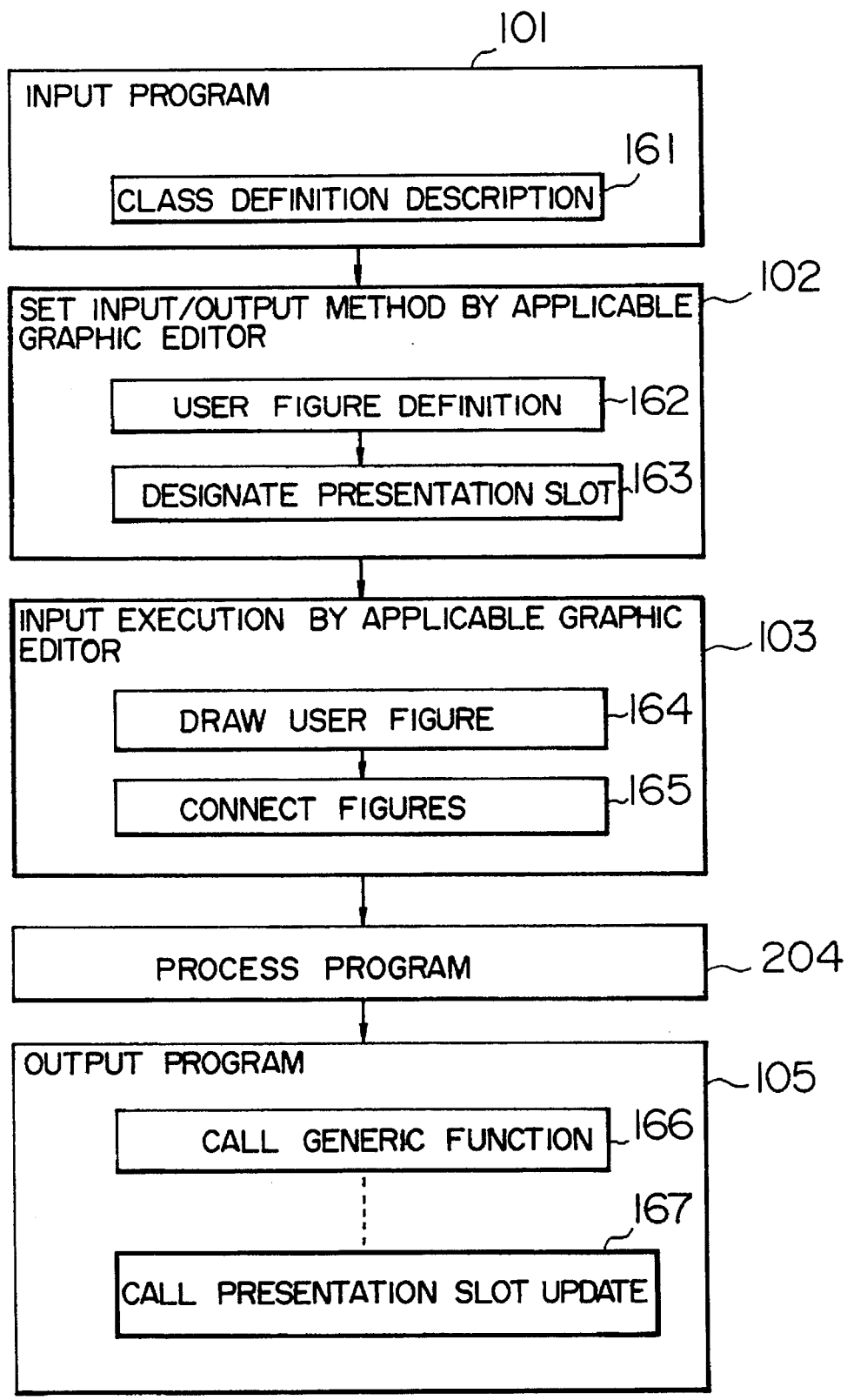
FIG. 1 represents a structure used for executing both a data input/output process and a design supporting process according an embodiment of the present invention.

Before describing various embodiments according to the present invention, an example of a system assumed based on prior art will now be explained with reference to FIG. 2, for the sake of an easy understanding of the present invention.

To input an instance indicative of a design component in a form of a graphic representation (figure) by way of a terminal screen, the graphic representation is previously inputted and a connection is made, by employing a graphic editor 221 (step 201), and graphic data 202 is outputted to a file. In an input program 203, after class definition of a component function has been performed (step 161), this graphic data 202 is read and a graphic representation corresponding to the instance is cut out (step 211). Then, the instance is produced in accordance with the cut result (step 212). Confirmation is made of the connections among the graphic representations (step 213), and a pointer is made between the instances for the graphic representations at both ends (step 214). Furthermore, in order that the instance is displayed in the same form as that of the input operation, namely the represented output can be directly utilized as the input, a presentation method is defined (step 215). In a process program 204, the method is called with respect to the thus formed and coupled instances, and a simulation is executed. As a result of this simulation, an output instance to be attention is outputted. In the output program 205, a generic function so-called as "presentation" is called while this output instance is used as an argument. A method called presentation of the class definition of this instance is called and then the graphic representation is obtained at the terminal screen.

It should be noted that the control operations for the execution of class definition, the generation of instance and the generic function among a series of the above-described process operations, are executed by the relevant portions in the object-oriented language process system 222.

In the above-described system technique, the input program must be considerably rewritten when the inputted figure is modified in order that the input interface of the object-oriented application program can be arbitrarily changed based on the interactive conditions and the contents to be inputted. As a result, the modifications of the format is not so easily performed. In other words, the programs (211 and 222) for cutting out a relevant figure from the figure data thereby to produce the instance must be separately produced. Also, such presentation methods that the outputted figure can be directly used as the inputted figure must be separately described (step 215). Although there are some possibilities that the inputted instances may be independently processed, there are many possibilities that a object constructed of several elements may be represented by combining a plurality of instances with each other. To represent the combination relationship of the instances by the lines for connecting the figures with each other, the programs (213 and 214) for producing the instances by confirming the connections from the graphic data must be formed every time the instance is produced.

Since a graphic representation which has been once displayed cannot be modified in the above-described system example, the simulation by the graphic presentation cannot be realized in which the output of the object-oriented program is displayed by not only displaying the condition of the instance at a certain time instant, but also the operations to the instance, and the variations of conditions, and also by modifying the graphic representation.

To solve the above-explained problems, one embodiment of the present invention will now be explained with reference to FIGS. 1 to 13.

Referring now to FIG. 1, this embodiment will be summarized.

First, an input program 101 is called thereby to execute a class definition description. As a result, a portion having no relation to input/output among the class definition is set.

Subsequently, an applicable graphic editor is applied so as to define a figure input/output method (102). In the definition on the figure input/output method, a user graphic representation (figure) is first performed by a figure edition processing unit. Then, a presentation method for performing this user graphic representation is produced and added to the above-described class definition. A definition group of a presentation slot which has been obtained by a presentation slot definition processing unit in an interactive manner, is added to the class definition. Accordingly, a reflection method for reflecting a presentation slot update in a displayed figure is added to the call definition.

Subsequently, a figure input operation is carried out with employment of the applicable graphic editor (103). In the figure input operation, the user figure is first drawn on a screen in response to a user figure drawing command of the figure edition processing unit. Then, instances of the corresponding classes are automatically produced by an instance production processing unit. Next, the user figures drawn on the screen are connected by lines by a connection processing unit. As a consequence, an instance coupling processing unit is called, and the instances corresponding to the figures positioned at both ends are coupled by a pointer.

Subsequently, a process program 204 is called while the above-described instance group is used as an input. The method defined by the class definition description 161 is called by the process program, so that simulation is executed. As a result, an instance to be noticed is outputted.

Next, an output program 105 is called. A generic function so-called as "presentation" is called by the output program, while the above-described outputted instances are used as an argument (166). Then, a presentation method of the class definition of this instance is called, whereby a presentation figure is obtained. Since this presentation figure owns the same format as that of the input figure, it is possible to handle this presentation figure in accordance with the same operation as the edition of the input figure. Also, when a slot update call 167 is made with respect to the instance, the reflection method is called and the figure can be automatically deformed so as to be coincident with a new slot value. This slot update call may be applied to the instance before a presentation generic function call 166 in order to directly deform the inputted figure.

A data input/output method and a design supporting (aiding) method according to an embodiment of the present invention will not be described in detail. Setting of an input/output method 102 by an applicable graphic editor, an input execution 103 by the applicable graphic editor, and also an output program 105 correspond to the data input/output method according to one embodiment of the present invention. An input program 101, setting of the input/output method by the applicable graphic editor, the input execution 103 by the applicable graphic editor, a process program 204 and the output program 105 correspond to the design supporting method according to one embodiment of the present invention. A detailed procedure of steps will be discussed later.

An apparatus utilized in the embodiment shown in FIG. 1 is explained with reference to FIG. 3. In FIG. 4, there is shown a software produced by the apparatus shown in FIG. 3. A design supporting (aiding) apparatus 191 corresponds to the design supporting apparatus employed in this embodiment, and is arranged by an object-oriented language process system 222 and an applicable graphic editor 112.

Figure 2:
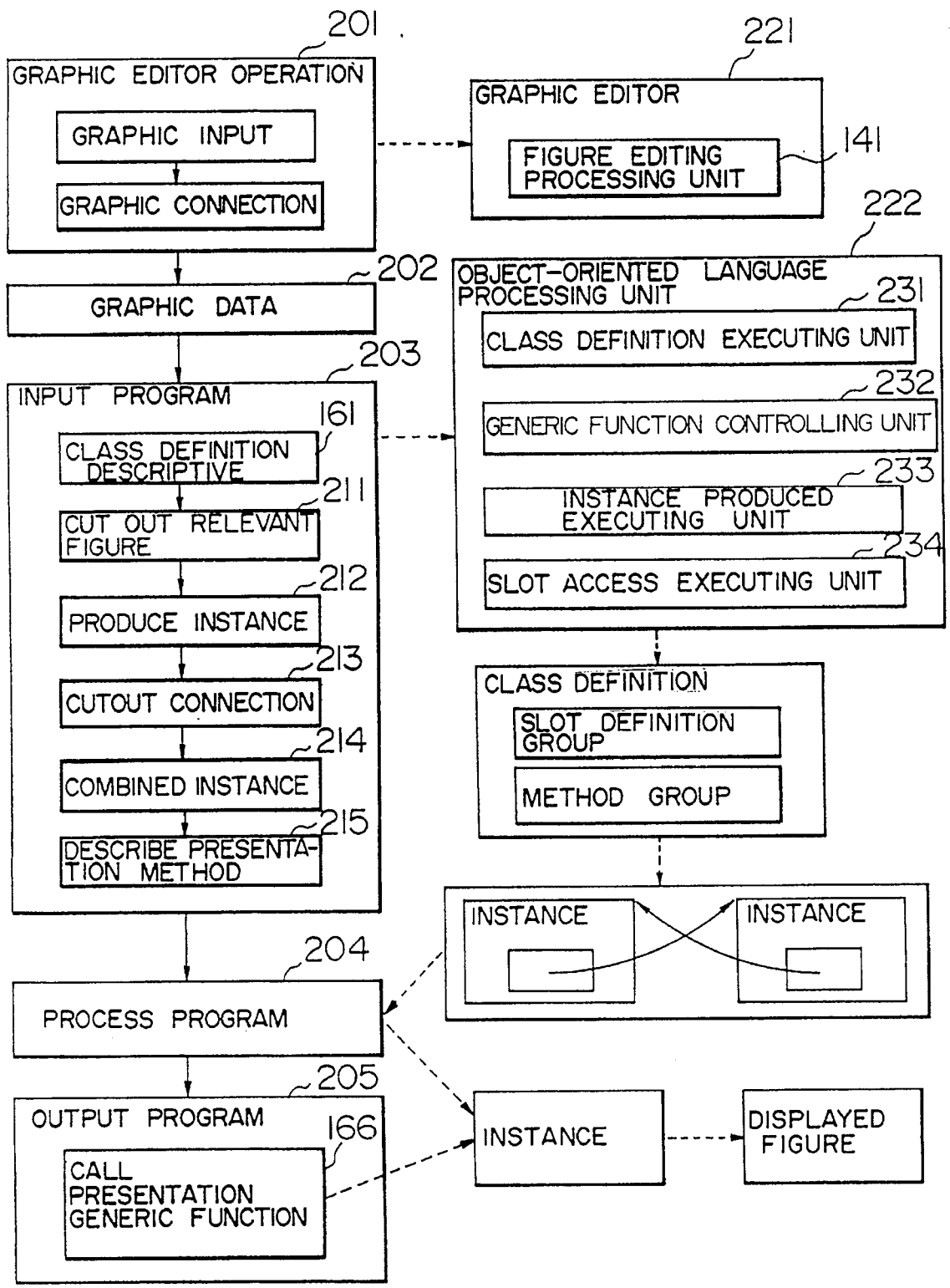
FIG. 2 illustrates an example of a system assumed from prior art.

The object-oriented language process system corresponds to such a language process system for satisfying the specification of CLOS (Common Lisp Object System), and comprises, as shown in FIG. 2, a class definition executing unit 231, an instance production executing unit 232, a generic function controlling unit 233, and a slot access executing unit 234. The contents of the CLOS language specification is described more in detail in "Common Lisp Object System Specification" by D. G. Bobrow et al., ANSI X 3J13 Document 88-002R (1988).

The applicable graphic editor 112 comprises a graphic edition processing unit 141, a presentation method production processing unit 142, a presentation slot definition processing unit 143, an instance production processing unit 144 and an instance connection processing unit 145.

The graphic edition processing unit 144 includes at least a user figure definition processing unit 146, a user figure drawing processing unit 147 and a connection processing unit 148. The user figure definition processing unit defines a figure or graphic representation (i.e., a user figure) inherent to a user by combining basic figures such as a box and a circle by operating, for instance, a mouse. The user figure drawing processing unit draws the user figure. The connection processing unit designates two of this user figure and connects them by a line.

The presentation method production processing unit 142 is called at the same time when the user figure definition processing unit 146. This presentation method production processing unit 142 produces a method (presentation method) for displaying the defined user figure and stores this method together with the graphic (figure) definition data into class definition thereof (reference numeral 121 of FIG. 4). A format of the presentation method will be described later with reference to a concrete example.

The presentation slot definition processing unit 143 is called within the user figure definition processing unit 143. Both a figure attribute (relative position, length, color, design etc.) and a name of slot of an element (basic figure such as box, circle and line) among the user figure are designated, and set into the class definition (reference numeral 121 of FIG. 4) as the presentation slot definition. A detailed procedure of designation and some additional operations will be explained with reference to a concrete example.

The instance production processing unit 144 is automatically called by the user figure drawing processing unit 147, and produces a single instance of a class corresponding to the relevant user figure.

The instance connection processing unit 145 is automatically called by the connection processing unit 148, and sets a bi-directional pointer between the instances corresponding to the user figures positioned at both ends. A format of the pointer will be discussed later as a concrete example.

It should be noted that the storage operations of the presentation method and the presentation slot into the presentation method production processing unit and the presentation slot definition processing unit are executed by the class definition execution unit 231 of the object-oriented language process system 222 shown in FIG. 2. The pointer in the instance connection processing unit is set by the slot access executing unit 234.

Next, both a detailed sequence of the data input/output and a detailed sequence of the design support will now be explained with employment of the applicable graphic editor. In FIG. 4, there is shown a software produced in accordance with the sequence of FIG. 1 and also an operation thereof. The input/output operations of the object at the AND gate class will now be explained as an example.

First, an input program 101 is called on the interactive type object-oriented language process system 222, so that the class definition description of the AND gate is carried out as shown in FIG. 5. The class definition description 161 is constructed of the slot definition description 301 and the method definition description 302, each of which is stored in the class definition of the AND gate class shown in FIG. 6 (401, 402, 403 and 408). The above-described operations are executed by the class definition execution unit 231 of the object-oriented language process system 222 shown in FIG. 2. It should be noted that the inputs 402 and the outputs 403 among the slot definition correspond to the previously determined slots which are utilized as connection slots (will be discussed later). The remaining slot definition and method definition (404 to 407, 409 to 411) among the definition shown in FIG. 6 will be set later by the applicable figure editor.

Subsequently, the applicable graphic editor is called so as to set the input/output method (102). A detailed sequence of the user figure definition (162) will now be described with reference to FIGS. 7 and 8. A selection is made of a user figure definition menu 501 of an initial screen 511 for the applicable graphic editor, and then the user figure definition processing unit 146. As a result, a screen 512 of the user figure definition newly appears. An arc drawing menu 522 is selected to draw an arc, a line drawing menu 521 is selected to draw three lines, so that a line of an AND gate is drawn. Next, a connection point designation menu 524 is selected. As a consequence, designation on the connection positions corresponding to the connection slot inputs and also the connection slot outputs are required (631) and thus this designation is executed by way of a command mouse (641, 642, 643).

Subsequently, a presentation slot designation menu 523 is selected. A detailed sequence of the presentation slot designation 163 will now be explained with reference to FIG. 9. When the presentation slot designation menu is selected, a selection of the figure element is required (731). Then, if a selection is made of an arc of a center, a list menu of the figure attribute of this arc is represented. Thus, if "with (716)" is selected, an input operation of a character chain is required and thus a title of the presentation slot "ignition sign" is inputted (732). Next, an end menu 525 is selected and the user figure definition process operation is completed.

The defined figure is newly added to the menu of this user figure by executing the user figure definition processing unit. The below-mentioned slot definition and method are stored into the class definition of the AND gate shown in FIG. 6 by the presentation method production processing unit 142, the presentation slot definition processing unit 143, and also the class definition executing unit of the object-oriented language process system which is called by these processing units.

First, definition 404 on the presentation slot "ignition sign" is stored. The definition on the presentation slot is constructed of a slot name and an initial value, and as this initial value, a value corresponding to the present representation is set. As an example of FIG. 6, it is so defined that the initial value is "a narrow line". At the same time, to update the value of the presentation slot, a method is set as a name connecting "update" after the slot name. In this example, a method "ignition sign update" 410 is set. Next, when the value of "ignition sign" is updated, a reflection method corresponding to the method for reflecting this value to the presentation is set. In this example, definition 411 on "update ignition sign: after" is set. In the CLOS language, a method with having such an identifier as "after" is automatically called just after a method having the same name but no identifier is called. It should be noted that in the definition on "update ignition sign: after", a function is obtained from a graphic slot 407, and a procedure method for applying to this function, an instance thereof, a value of an x-position slot 405, and a value of an y-position slot 406 as an argument, is defined. Both the x-position slot 405 and the y-position slot 406 correspond to the previously determined presentation slots, and are added to the class definition in a similar manner to the designated presentation slot "ignition sign" 404.

Also, the definition on the drawn figure is stored as a slot initial value of the graphic slot definition 407 as such a function (figure definition function) for sequentially executing both a title of drawing function and an attribute list (execution form of drawing) with regard to the respective figure elements. A procedure method 409 for calling this figure definition function so as to represent itself is stored as a presentation method. In the example of the figure definition function shown in FIG. 6, a drawing function so-called as line drawing and arc drawing has been utilized. It should be noted that as to the attribute designated as the presentation slot, the format to refer to the presentation slot is stored instead of the attribute value. In the example of FIG. 6, as the value of the keyword: "width" for the arc drawing, a symbol "ignition sign" corresponding to the reference format for the presentation slot "ignition sign" has been used instead of the value of the actually drawn "narrow line". In accordance with the presentation method 409, the instance, x-coordinate and y-coordinate are used as the arguments; both the x-coordinate and the y-coordinate are set to the x-position slot 405 and the y-position slot 406; and the figure definition function is obtained by the graphic slot 407, to which the procedure for applying the x-coordinate, y-coordinate, and the object per se as the arguments is defined.

Figure 10A:
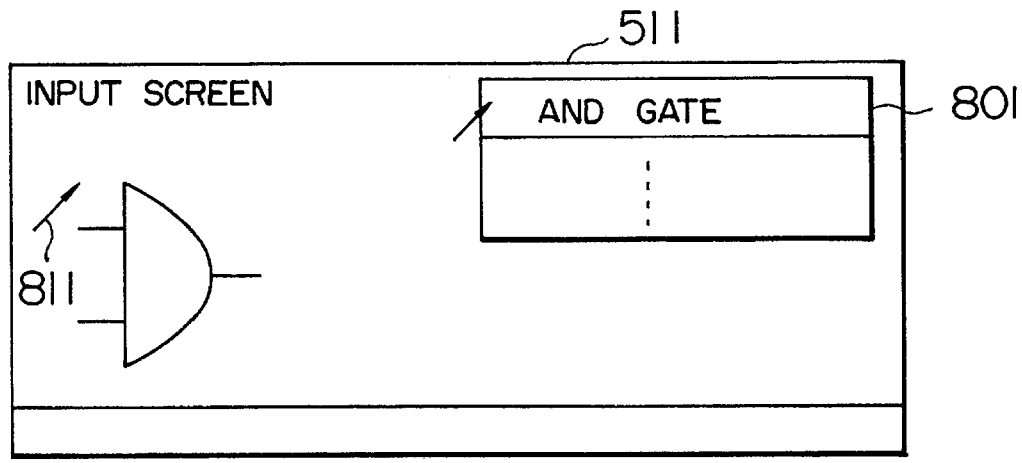
FIGS. 10A to 10C schematically represent in detail a sequence of user graphic drawing of FIG. 1.
Figure 10B:
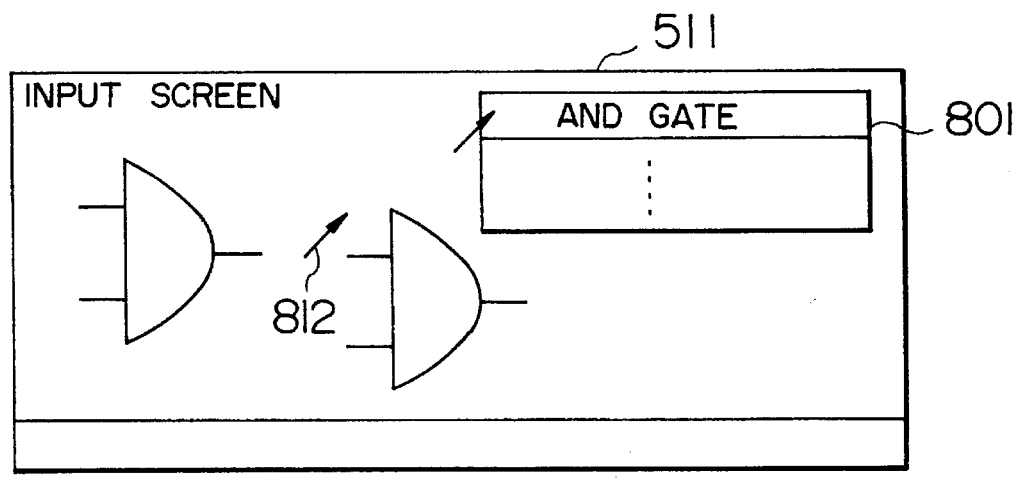
Figure 10C:
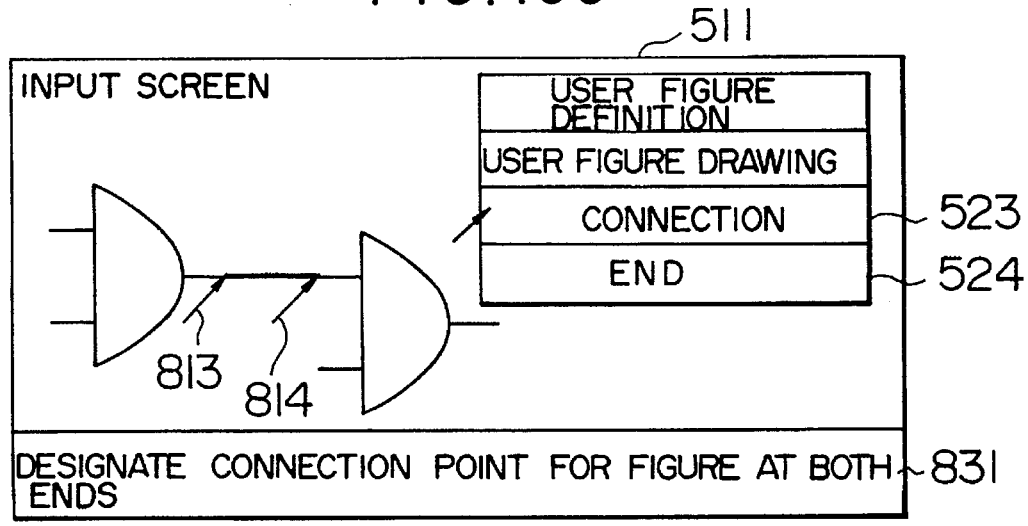

Subsequently, an input operation is executed by the applicable figure editor (103). In execution of this input operation, a user figure drawing menu (reference numeral 502 of FIG. 7A) is selected and the user figure drawing processing unit 147 is called. Detailed sequences of the user figure drawing 164 and the figure connection 165 are illustrated in FIGS. 10A to 10C, whereas the produced instances are indicated in FIGS. 11A to 11B. Upon call of the user figure drawing processing unit, a list menu of the user figure is represented. A selection is made of an AND gate menu 801, and a designation is established on an upper position of the user screen (811). Accordingly, the presentation method 409 for the class definition of the AND gate is called and displayed as shown in FIG. 10A. At this time, an instance 122 at a class of an AND gate is automatically produced (instance production process). At this time, the x-coordinate and the y-coordinate of the drawing position are to be set at presentation slots x-position 911 and y-position 912. When another AND gate is drawn (812), another instance 123 is produced in a similar manner to the above operation.

Next, a connection menu 503 is selected thereby to initiate the connection processing unit 148. As a result, since designation of a connection figure is required, an AND gate at an input side and also an AND gate at an output side are sequentially designated by a mouse (813, 814). Since there are two input connection points in the drawing at the output side, also the connection points are designated. Accordingly, a connection is made in accordance with the previously designated connection position. At the same time, as represented in FIG. 11B, the AND gate 123 at the output side is added to the outputs slot 914 of the AND gate 122 at the input side, and conversely, the AND gate 122 at the input side is added to the outputs slot 923 of the AND gate 123 at the output side (instance connection process).

Thereafter, the operation of the applicable graphic editor is completed by an end menu 524.

Next, a process program 204 is called. In the process program, for instance, a method "apply a voltage" 408 is called. As a consequence, a simulation of an object to be designed which has been inputted as an instance group is performed. After several methods have been called, an instance 124 in question is selected and the selected instance 124 is passed to the output program. It is assumed that the instance 124 corresponds to an instance at an AND gate class, and has the same slot value as that of the instance 122.

That, an output program 105 is called. In the output program, a generic function "presentation" is called under such a condition that the instance 124 transferred from the process program, the x-coordinate and the y-coordinate are used as the arguments. When the "presentation" is called (166), a presentation method 408 for the class definition of this class is called by the operations of the generic function controlling unit in the object-oriented language process system 222. In the presentation method, a function 918 for the figure definition which has been stored in the graphic slot of this slot is called. In a function for the function of the figure definition, a drawing function (1011 and 1012) is called by adding relative coordinates of the respective elements (for example, as to an arc, x is equal of 10 and y is equal to 20) to the x-coordinate and the y-coordinate of the argument. A presentation FIG. 125 is obtained by executing this drawing function. Since this presentation figure owns the same format as that of the input figure, this presentation figure may be designated by the mouse for edition purposes with employment of the applicable graphic editor in a similar manner to that of the input figure.

Figure 12:
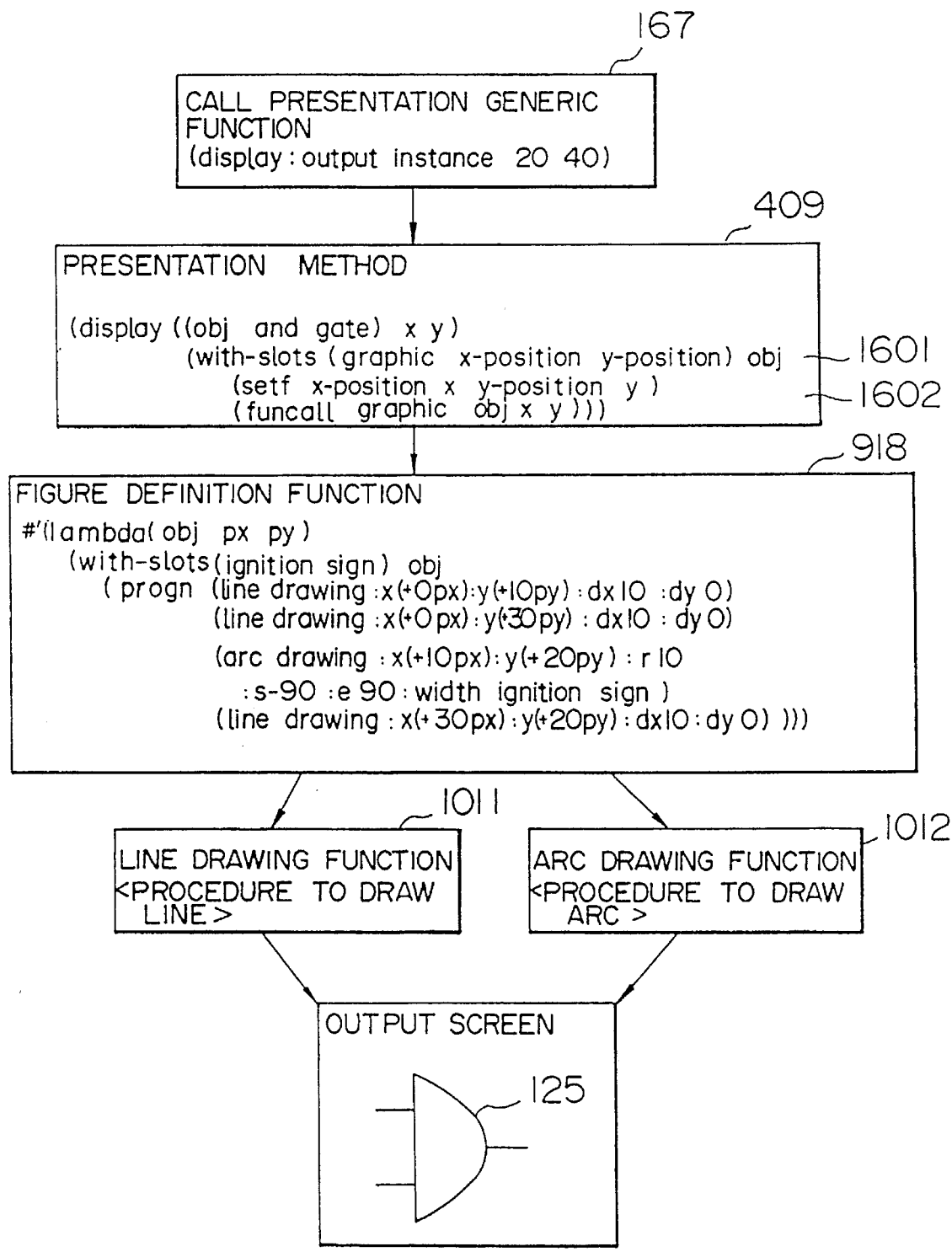
FIG. 12 is an illustration for showing in detail a display operation by calling the display generic function of FIG. 1.
Figure 13:
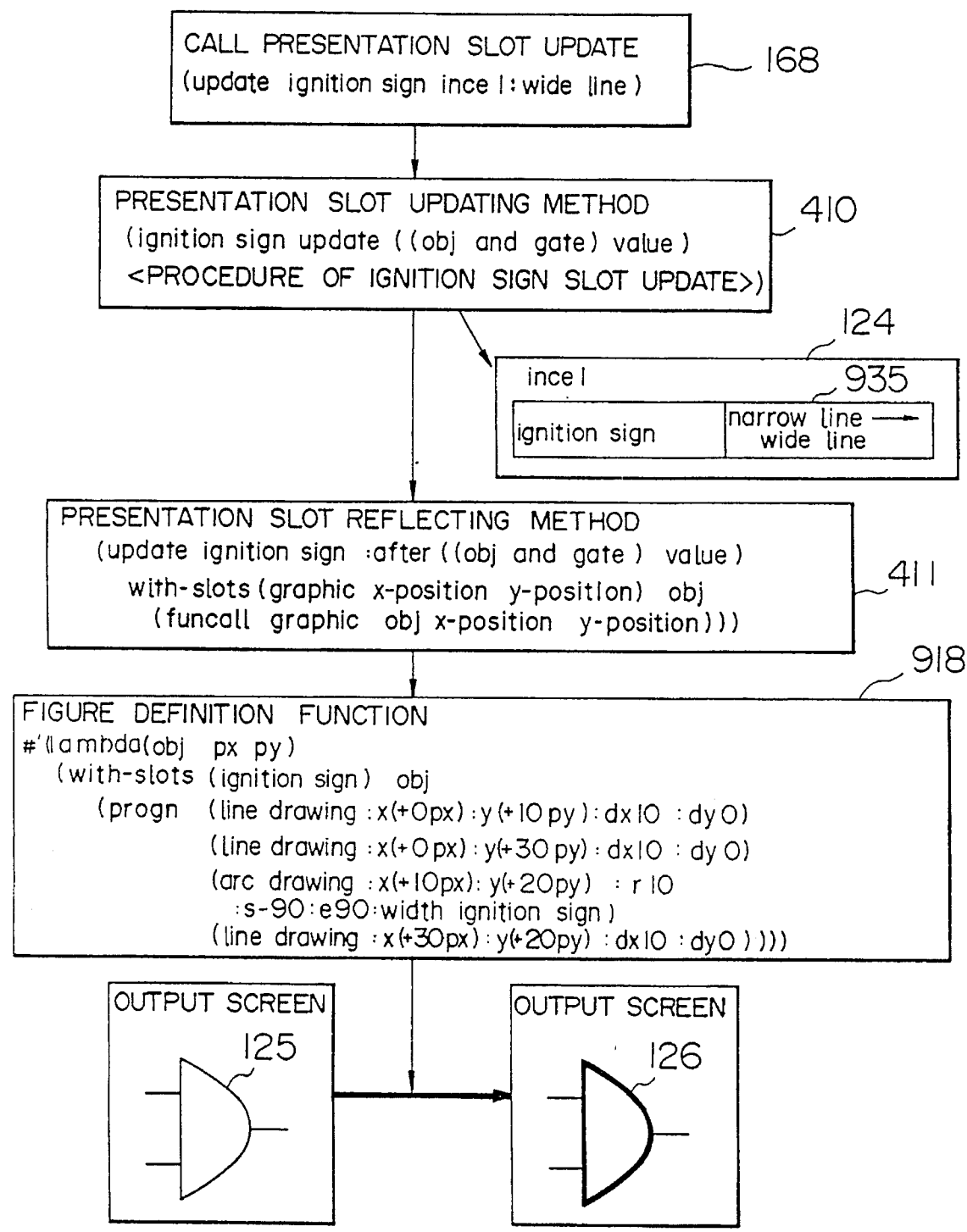
FIG. 13 represents in detail a modified operation by calling the presentation slot updating of FIG. 1.

Also, in accordance with the output program, with regard to either an input figure or a displayed figure, when a voltage is applied to, for example, an instance, it is possible to make such a call capable of updating a value of a presentation slot "ignition sign" of this instance as a wide line. An operation of a presentation slot update is shown in FIG. 13. Upon calling of "ignition sign update" (167), an "ignition sign update" method 410 for the class definition of this instance, and subsequently a reflection method "ignition sign update: after" 411 is called by the operations of the generic function control unit 233 of the object-oriented language process system 222 shown in FIG. 2. In the "ignition sign update" reflection method, a function 918 of a figure definition is called in a similar manner to that of the display method 409 in the presentation operation as indicated in FIG. 12. However, if a value 915 of the presentation slot "ignition sign" is referred to as the argument of the arc drawing in this case, a new value "wide line" is obtained, so that a modification 126 in which an arc portion is displayed by the wide line is represented.

Referring now to FIGS. 14 to 25, another embodiment of the present invention will be described.

Figure 14:
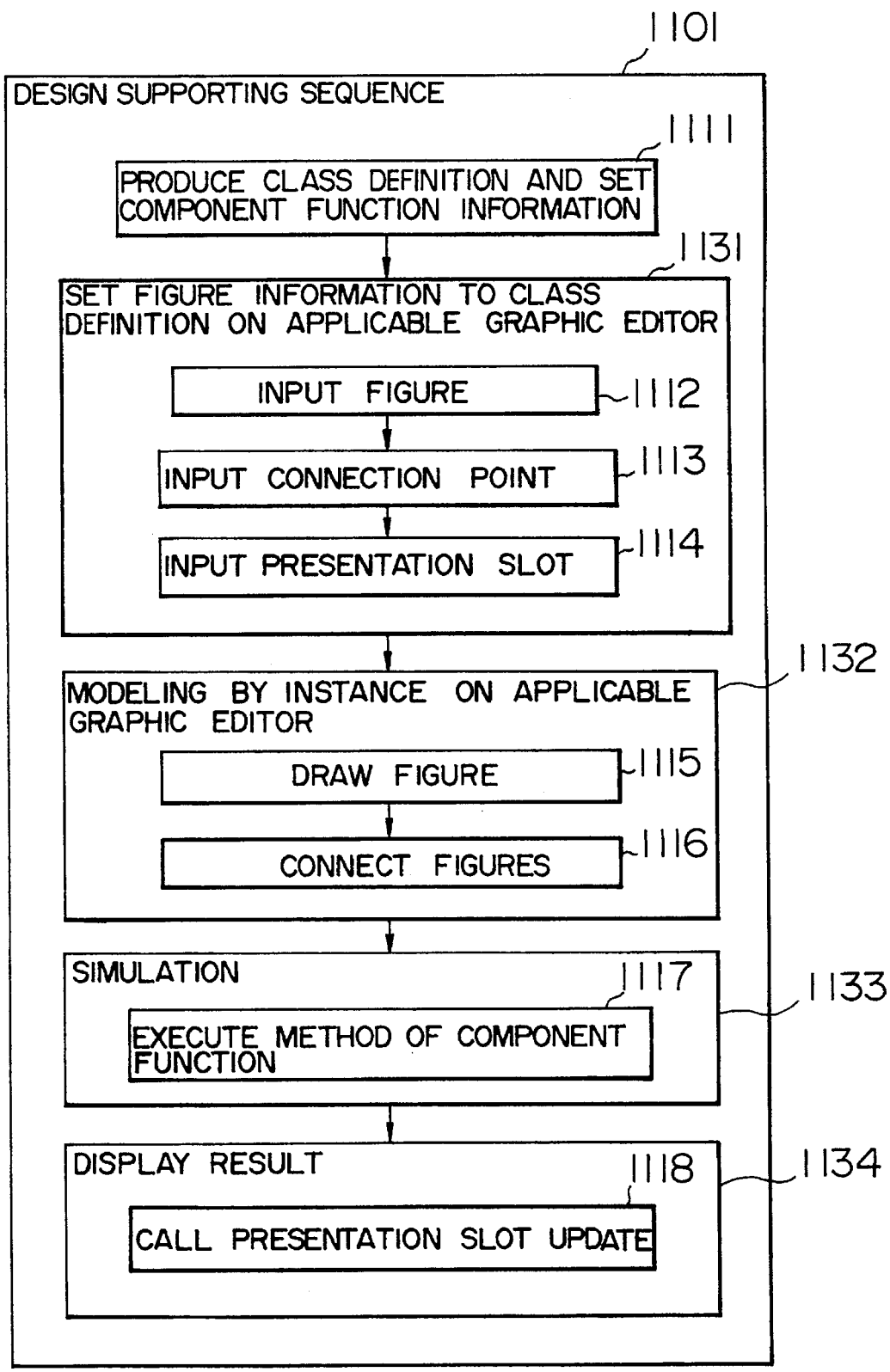
FIG. 14 schematically shows a structure of another embodiment of the present invention.

First, this embodiment will now be summarized with reference to FIG. 14.

At the beginning, a production of a class definition and a setting operation of component function information are executed (1111). Next, an applicable graphic editor is called to set graphic information to the class definition (1131). In the setting of the graphic information, a user figure is drawn by an operator who manipulates a mouse so as to designate the corresponding class (1112). Then, a presentation method for drawing this figure is produced and is added to the above-described class definition in combination with the figure format. Next, a designation is made of a connection point for the user figure by the operator (1113). As a result, the connection method is generated and the generated method is added to the class definition. Subsequently, a presentation slot of the user figure is designated by the operator (1114). Thus, a reflection method for reflecting a presentation slot update onto a presentation figure is added to the class definition.

Subsequently, a model input by an instance is executed with employment of the applicable graphic editor. In the model input operation, the user figure is drawn on a screen by the operator (1115). Then, an instance of the corresponding class is produced. Next, the user figure drawn on the screen is connected by the operator (1116). As a consequence, the instances corresponding to the figures positioned at both ends are connected by a pointer by a connection method.

Thereafter, a method of a component function is called (1117), so that a simulation is carried out. In the presentation for the result of this simulation, a presentation slot update call (1118) is executed. Thus, the reflection method is called and the figure is deformed in order to be coincident with a new slot value, whereby animation is carried out.

Figure 15:
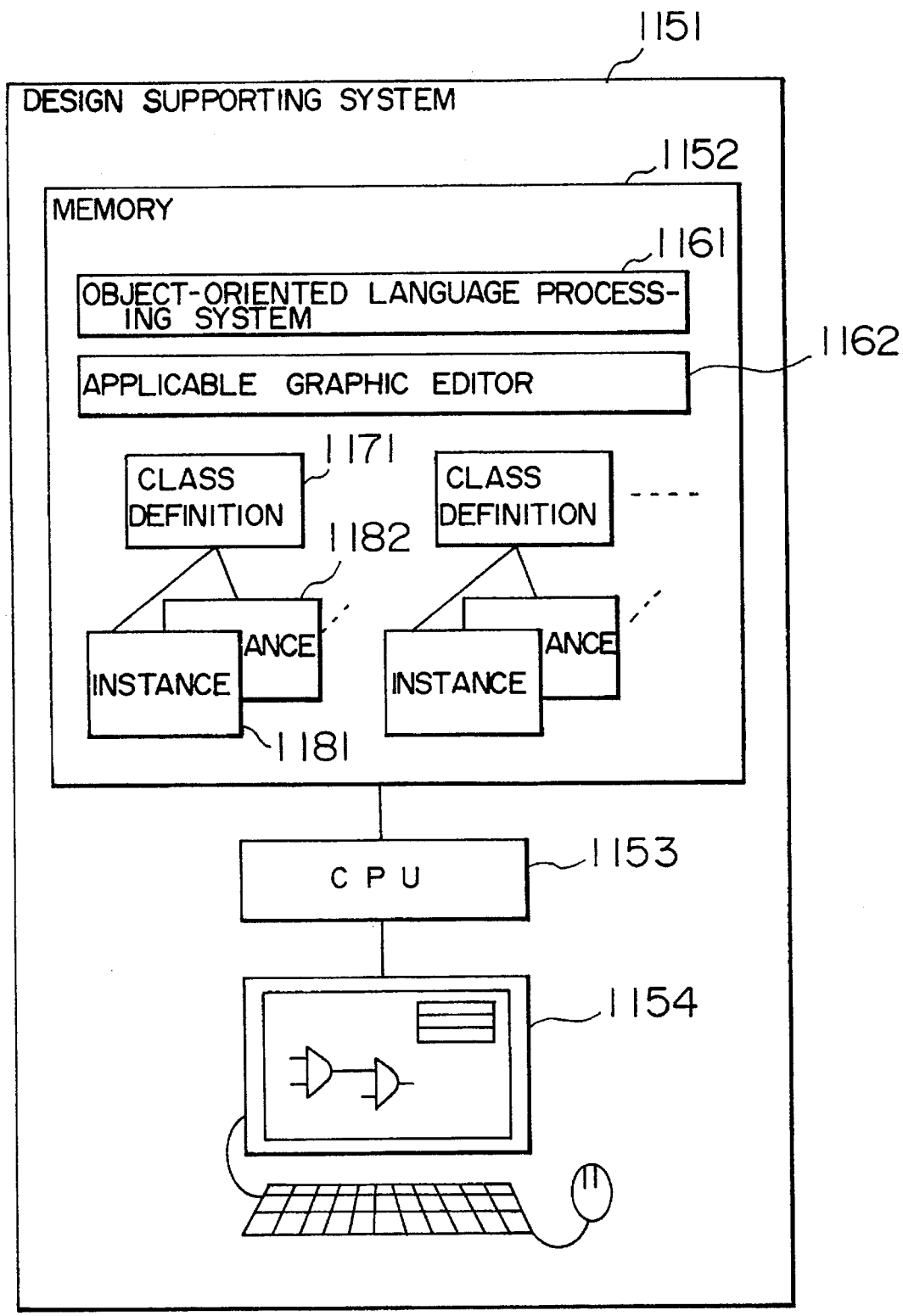
FIG. 15 schematically represents a design supporting system employed in the embodiment of FIG. 14.
Figure 16A:
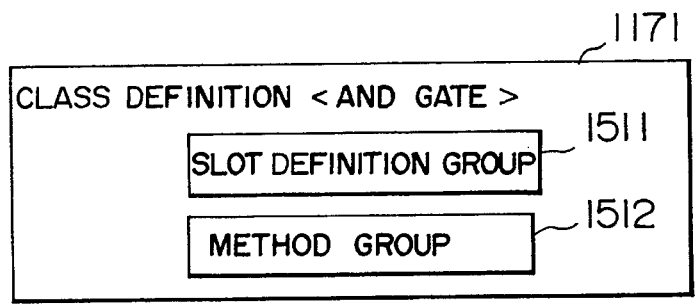
FIGS. 16A and 16B schematically show examples of both a structure of class definition and a structure of slot definition unit shown in FIG. 15.
Figure 16B:
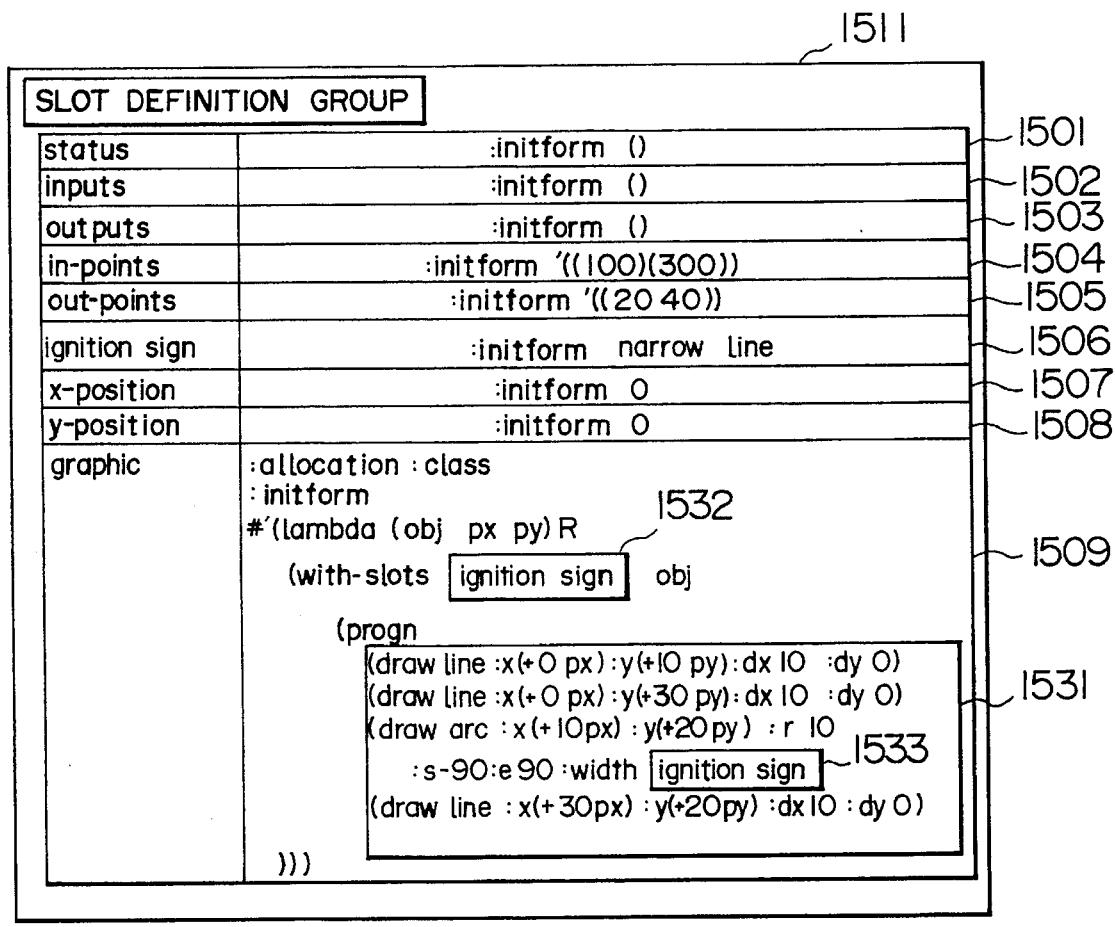
Figure 18:
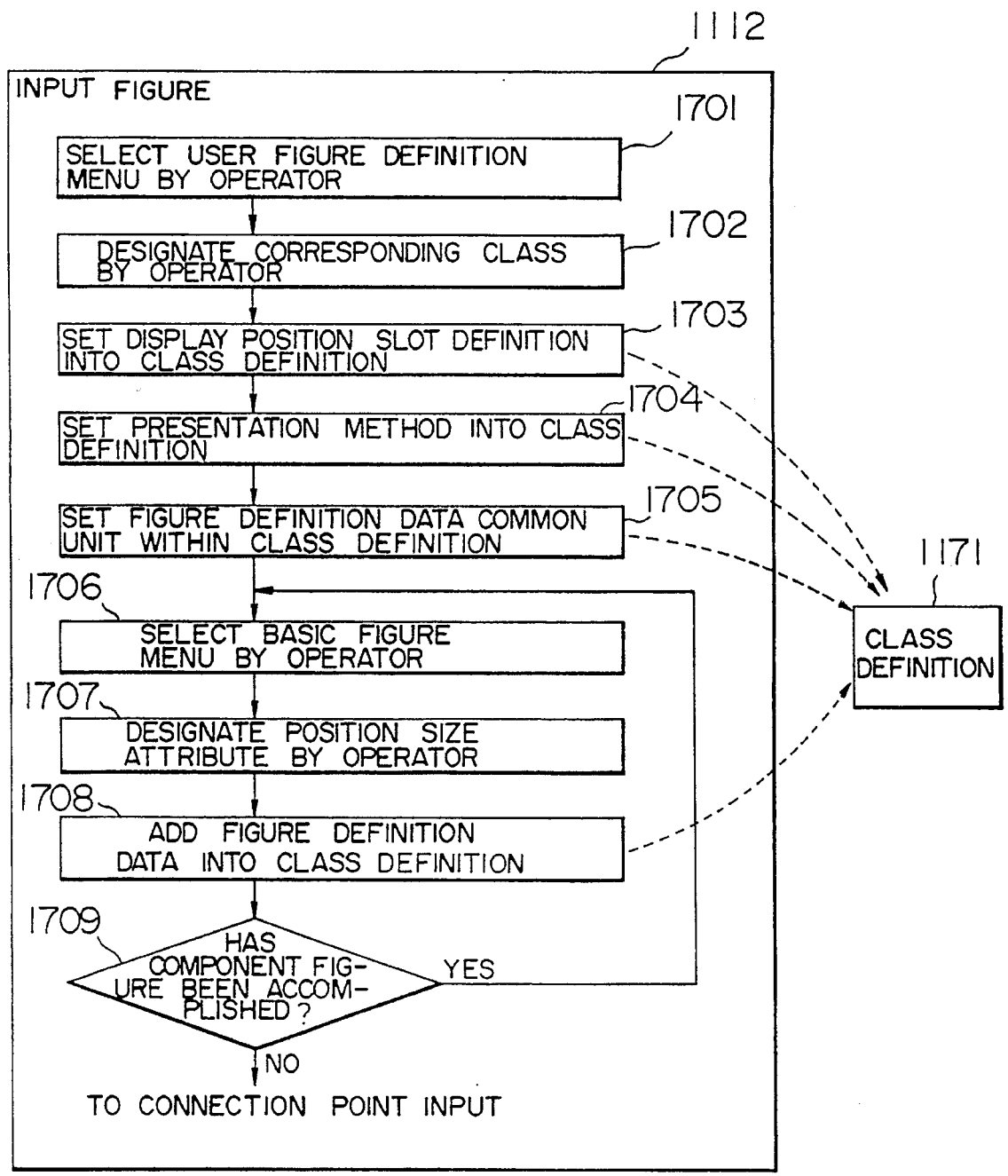
FIG. 18 schematically shows in detail a graphic inputting operation of FIG. 14.

The present embodiment will now be explained more in detail with reference to FIG. 14. FIG. 15 represents a design supporting (aiding) system used in this embodiment.

A design supporting system 1151 employed in a design supporting sequence 1101 is arranged by a memory 1152, a CPU (central processing unit) 1153, and a terminal 1154. An object-oriented language process system 1161 and an applicable graphic editor 1162 are mounted on the memory 1152, and class definitions 1171, - - - , and instances 1181, 1182, - - - , are produced in accordance the design supporting sequence 1101.

The object-oriented language process system 1161 is such a language process system capable of satisfying the specification of CLOS (Common Lisp Object System), and owns various functions such as a class definition, an instance production, a generic function control, and a slot access. The content of the CLOS language specification may be the same as in the previous embodiment.

Figure 3:
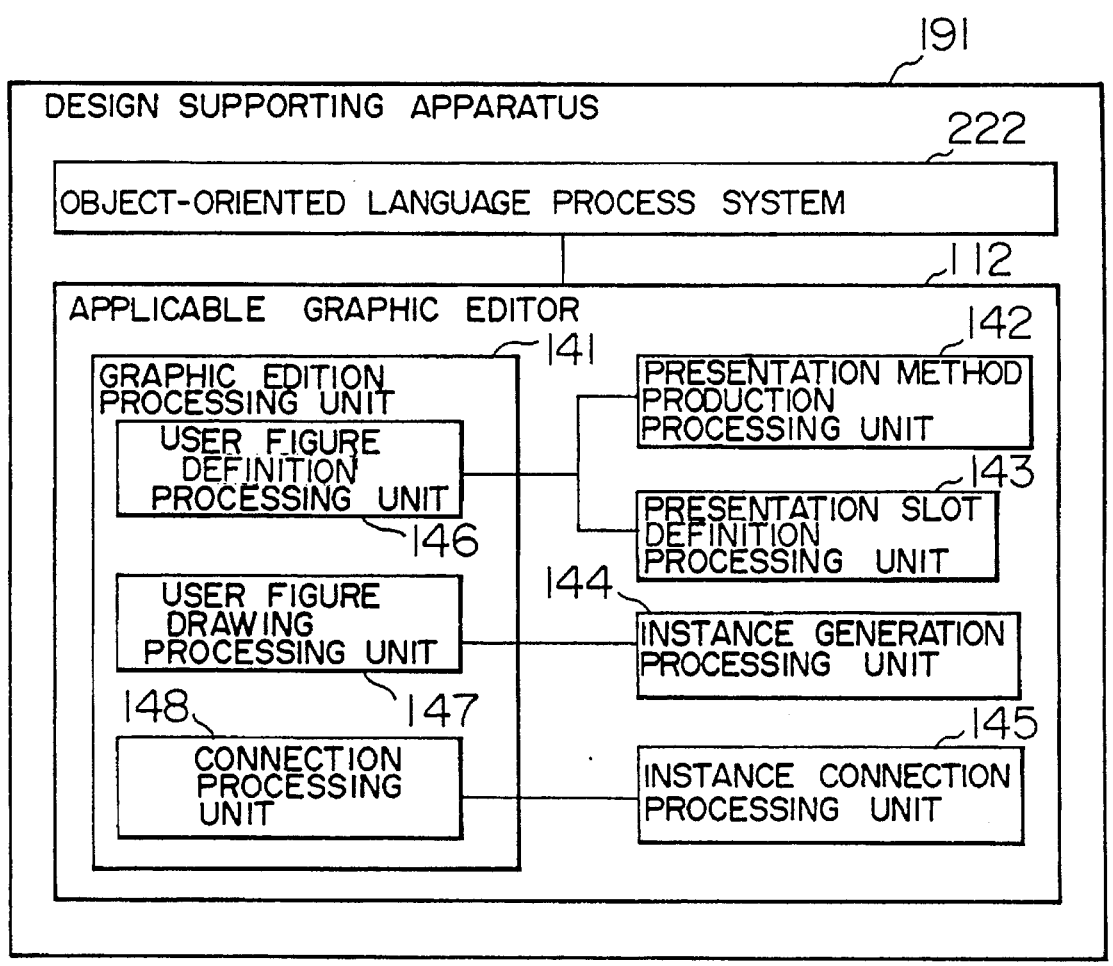
FIG. 3 schematically shows an arrangement of an applicable graphic editor and also a design supporting apparatus employed in the embodiment shown in FIG. 1.
Figure 4:
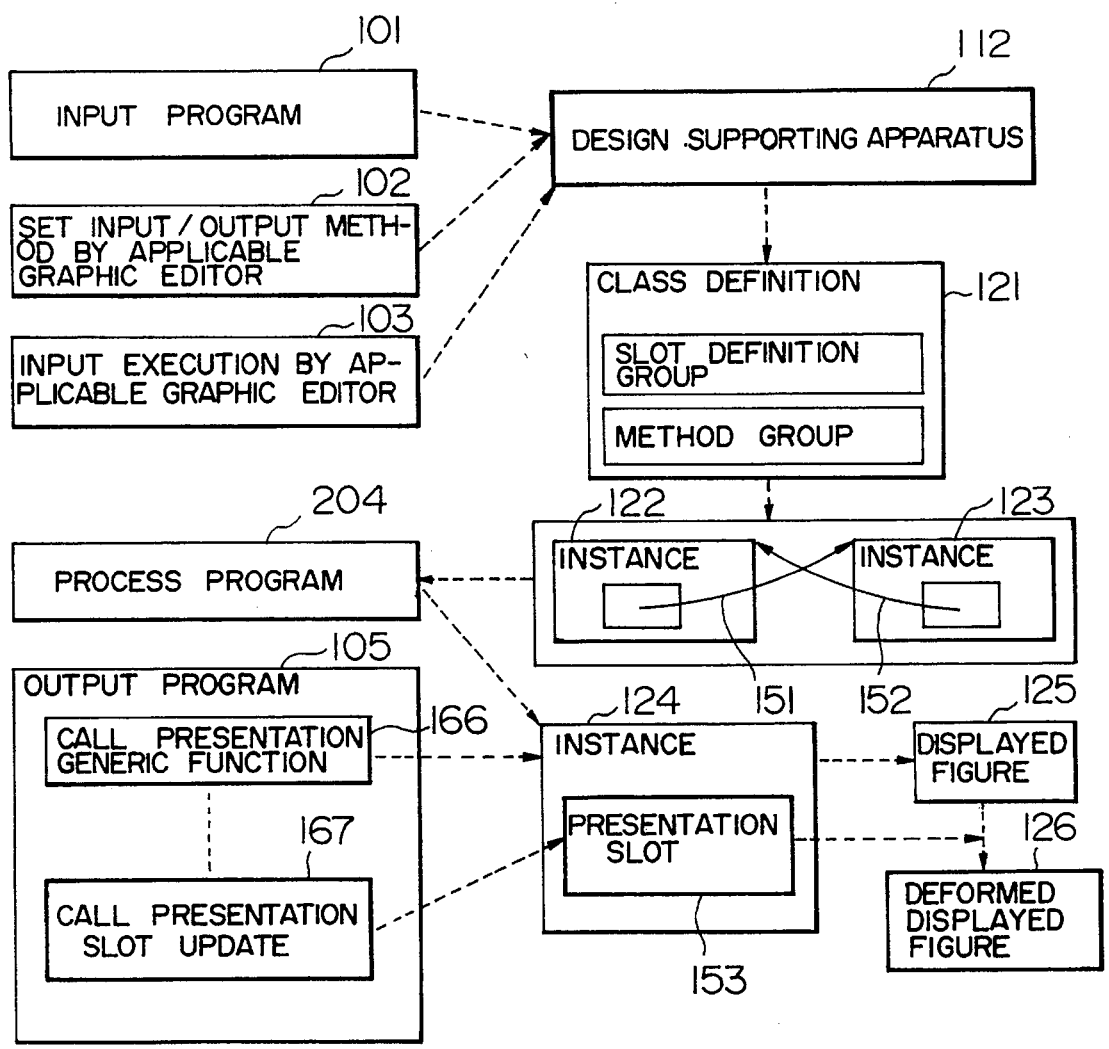
FIG. 4 schematically represents a summary of an input/output operation performed in the embodiment shown in FIG. 1.
Figure 7A:
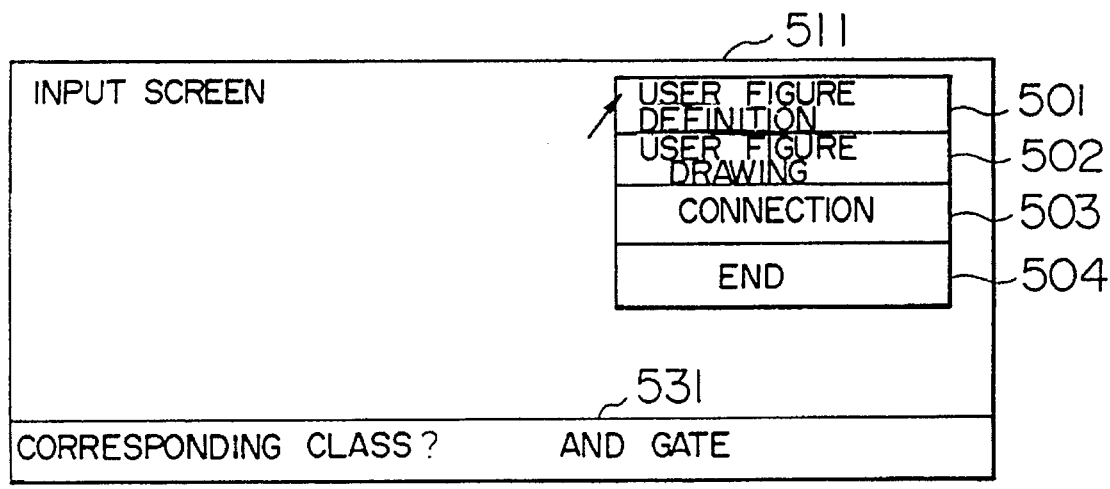
FIGS. 7A to 7C schematically show in detail a sequence of the user graphic definition shown in FIG. 1.
Figure 7B:
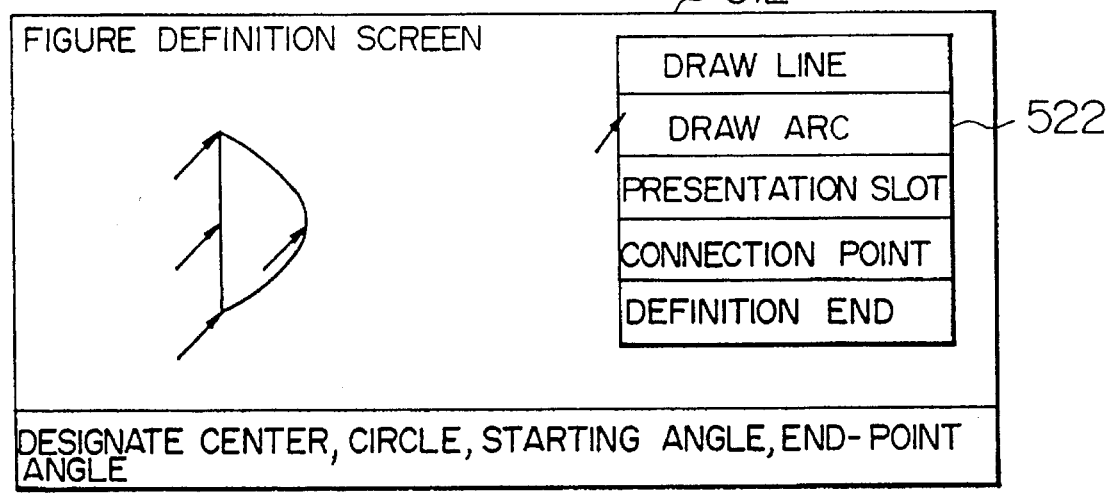
Figure 7C:
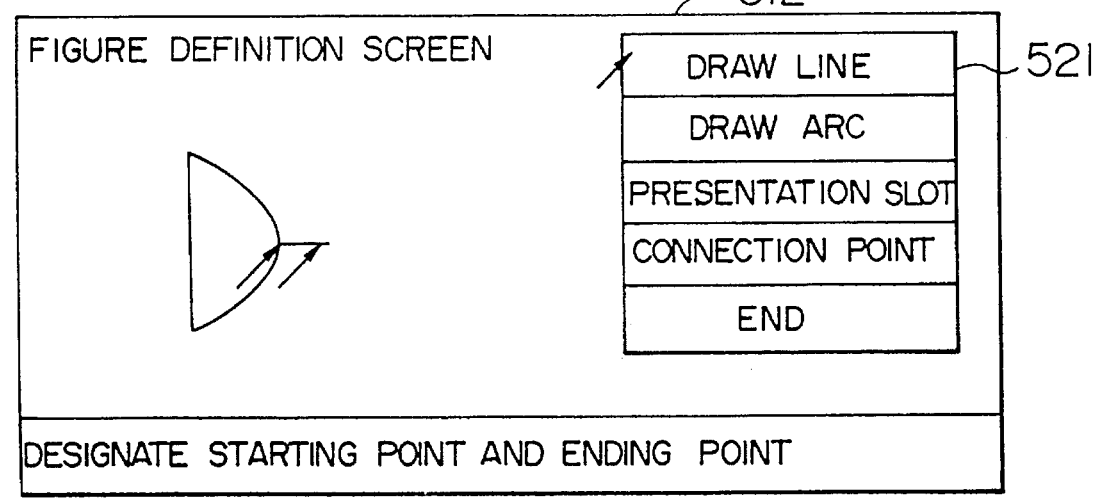
Figure 8:
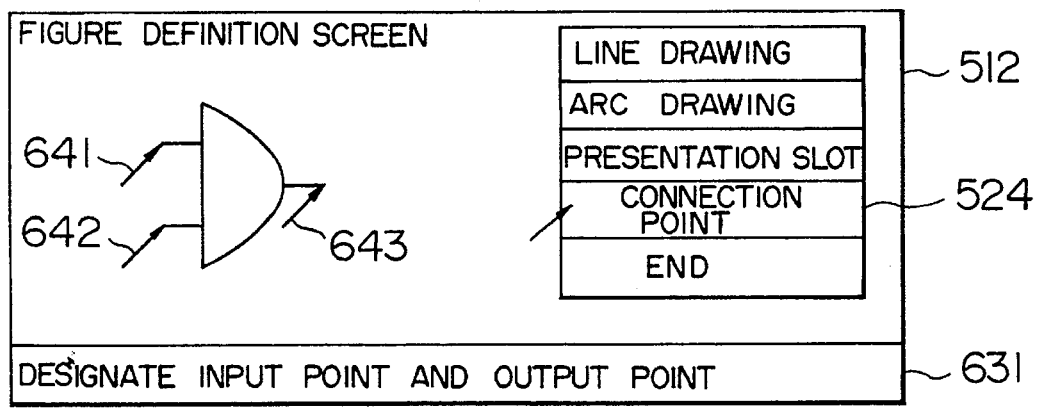
FIG. 8 schematically represents in detail a sequence of connection point designation used in the user graphic definition shown in FIG. 7.
Figure 9A:
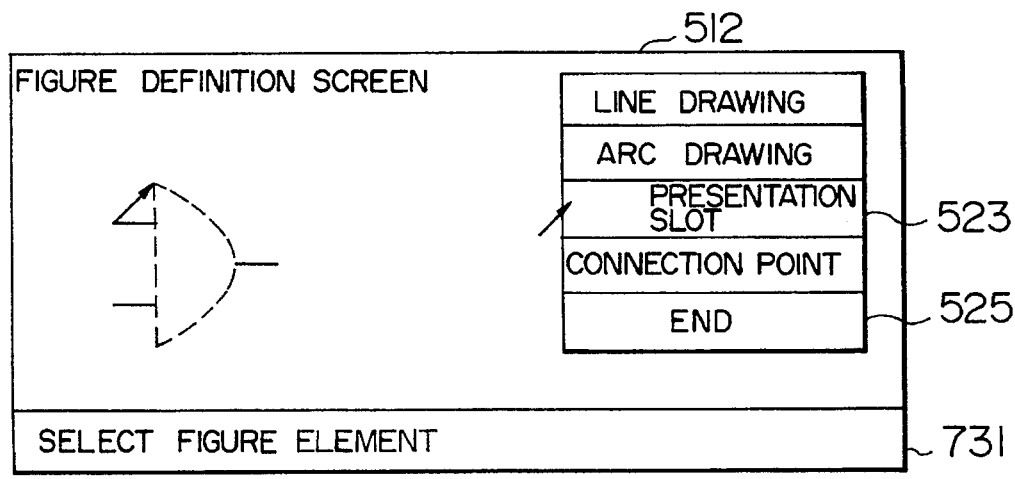
FIG. 9A and 9B schematically show in detail a sequence of presentation slot designation indicated in FIG. 1.
Figure 9B:
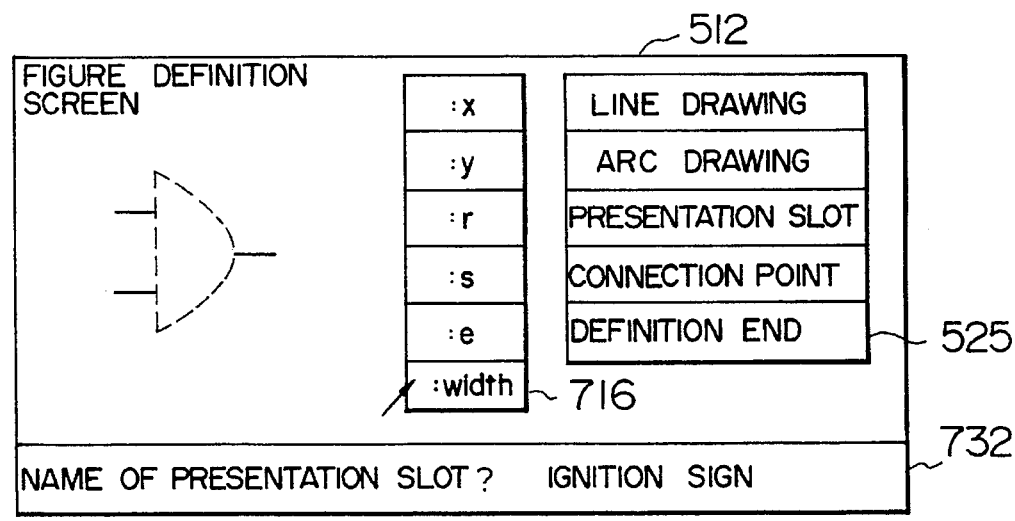

The applicable graphic editor 1162 has such an arrangement as shown in the figure edition processing unit 141 of FIG. 3.

The user figure definition processing unit 146 produces programs required for an input of an instance, modeling, and an animation representation by inputting the user figure, while utilizing a mouse by an operator. In the user figure definition processing unit, an operator forms a figure or a graphic representation specific to this user (namely, user figure) by operating the mouse to combine basic figures such as a box and a circle with each other, and then designates the corresponding class. In addition thereto, a connection point of the user figure and a presentation slot is designated. Then, a presentation method, a connection method, a presentation slot update method and the like other than the figure definition data are automatically produced, and the resultant methods are stored into the class definition thereof (reference numeral 1171 of FIG. 15). The presentation slot update method is to realize an animation by the presentation slot update call 1118.

The user figure drawing processing unit 147 inputs an instance with employment of the programs produced by the user figure definition processing unit 146. In the user figure drawing processing unit 147, when an operator designates a user figure, a figure can be drawn by the presentation method and a single instance of the class corresponding to the relevant user figure can be produced.

The connection processing unit 148 performs a modeling by utilizing the programs formed in the user figure definition processing unit 146. In the connection processing unit 148, when an operator designates two user figures, these two user figures can be connected with each other by a line and furthermore a bidirectional pointer can be set between the instances corresponding to the user figures positioned at both ends by the connection method. It should be noted that the setting operations of the method and slot to the class definition, and also the production of the instances are performed by the object-oriented language processing unit 1161 in the applicable graphic editor 1162.

Then, a description will now be made of a sequence 1101 for a design support in which an AND gate component is employed as an example.

First, a class definition program of an AND gate function is executed, and the class definition is produced, and also the component function information is set by the object-oriented language processing system 1161 (1111). In FIG. 5, there is shown an example of class definition description of the AND gate function. The class definition description 161 of the component function is arranged by a slot definition description 301 and a method definition description 302, which are stored into the class definition 171 of the AND gates shown in FIGS. 16 and 17 (1501, 1502, 1503 and 1601). The above-described executions are handled by the object-oriented language processing system 1161. It should be noted that inputs 1502 and outputs 1503 among the slot definition correspond to a previously determined slot which will be utilized as a coupling (connecting) slot.

Next, the applicable graphic editor is called to perform the setting operation of the figure information to the class definition (1131). In the setting operation of the figure information, the figure corresponding to the class is first inputted and then the method used for the graphic representation is set into the class definition 1171 (1112). A detailed sequence operation of the figure input 1112 will now be explained with reference to FIGS. 18 and 7. A selection is made of a user figure definition menu 508 of an input screen 511 for the applicable graphic editor by an operator and also a corresponding class is designated (1702). It should be noted that designation is made of an "AND" gate 531 by the operator. Then, previously determined slot definition information (reference numerals 1507 and 1508 of FIG. 16) indicative of a display position is defined in this class definition 1171 (1703). Subsequently, a presentation method (reference numeral 1602 of FIG. 17) is set (1704). The presentation method corresponds to a previously determined method having a procedure for displaying itself with reference to the figure definition slot 1509. Next, a common part of figure definition data (part excluding 1531 from 1509 of FIG. 16) is set (1705). The figure definition data common part contains information used to hold the figure definition data as a function (figure definition function). Next, since a screen 512 of the user figure menu is selected by an operator (1706), whereby a position, a dimension and an attribute and the like are designated (1707). Then, the definition on the figure is added to the figure definition function a series of list (drawing function call) for both the drawing function name of the respective figure elements and the attribute (1708). It should be noted that since an arc drawing menu 522 is selected to draw an arc, a line drawing menu 521 is selected to draw three lines, and therefore a figure of an AND gate is drawn, a series of drawing function calls for both the arc and line (1531 of FIG. 16) is added.

Subsequently, a designation is made of a connection point, and a method for connecting a connection line and an instance is set into the class definition 1171 (1131). A detailed sequence of the connection point designation 1113 will now be explained with reference to FIGS. 19 and 18. As a first step, a connection point designation menu 524 is selected by an operator (1901). As a result, a designation for a connection position is required in a message form 2001, whereby the designation is performed by a mouse (1902). Thus, definition information of the slot (1504 and 1505 of FIG. 16) indicative of the connection point is set within the class definition (1903). It should be noted that the names of slots "in-points" and "out-points" are previously determined, and the coordinates of the designation positions (2002, 2003, 2004) are used as initial values of slots. Furthermore, the previously determined connection method (1603 of FIG. 17) is set into the class definition (1904). The connection method owns such a procedure that output-points itself and points at both ends from in-points of an opposer are selected to be connected with each other, the opposer is set into the outputs itself, and the itself is set to the inputs of the opposer.

Then, a designation is made of a presentation slot and thus a method for describing an animation is set to the class definition 1171 (1114). A detailed sequence of the presentation slot designation 1114 will now be described with reference to FIGS. 20 and 9A to 9B. A selection of a presentation slot designation menu 582 is done by an operator at the beginning (2101) (see FIG. 9A). Then, a selection of a figure element is required in a message form and then a designation thereof is performed by use of a mouse (2102). In this example, an arc of a center is selected. Thereafter, a list menu for a figure attribute of this arc is displayed, from which an attribute is selected (2103). In this example, "width (2202)" is selected Subsequently, an input of a presentation slot name is required in a message form, which is designated by a character series (2104). In this example, such a designation "ignition sign" 2203 is made. Then, the slot definition information (1506 of FIG. 16B) of the designated name is set to the class definition 171 (2105). An initial value of the slot is selected to be a value corresponding to the present representation. In this example, a "narrow line" is selected. Also, a presentation slot update method (1604 of FIG. 17) is set (2106). It is assumed that a title of this method is a method for connecting a slot name with "update". The definition on the method is previously determined except that a slot to be updated is different from each other. Furthermore, a reflection method (1605 of FIG. 17) for reflecting the slot update on the representation is set (2107). It is assumed that a title of this method is such a method that an identifier so-called "after" has been added to the presentation slot update method. The definition of the method is previously determined, a function as figure definition data is obtained from the graphic slot (1509 of FIG. 16B), and then both an instance thereof, and values of an x-position slot 1507 and also of an y-position slot 1508 are applied as arguments. The method with the identifier "after" is executed just after the method having no identifier in the specification of the object-oriented language CLOS. Furthermore, the description of this attribute for the figure definition function which has been stored as the initial value of the figure definition slot, is substituted from the attribute value into a reference form to a presentation slot (2108). In the examples shown in FIGS. 6A to 6B, definition 1532 on a symbol "ignition sign" as a reference format of a presentation slot "ignition sign" is given, and a value so-termed "narrow line" which is actually drawn is changed into a symbol "ignition sign" 1533 as a keyword of drawing an arc "width". With the above-described operation steps, such a mechanism has been prepared that the presentation slot update method is called to deform the displayed figure.

At a final stage, a definition ending menu 528 (see FIG. 9B) is selected by the operator. As a consequence, the figure information setting operation 1131 for a single class is completed. The figure information setting operations of several classes are carried out by repeatedly performing the above-described sequential operation. It should be noted that the setting operation to the class definition is executed by the object-oriented language processing system 1161.

Subsequently, a modeling is performed by an instance with employment of an applicable graphic editor. In the modeling, a figure is first drawn thereby an instance (1115). A detailed sequence of the figure drawing operation 1115 will now be described with reference to FIGS. 21, 10A and 10B. First, a user figure drawing menu (502 of FIG. 7A) is selected by an operator (2301). Next, a user figure is designated from a menu by the operator (2302), and further a drawing position is designated by manipulating a mouse (2303). In this example, an AND gate 2401 is selected and a designation of picture drawing is made at a upper left portion 2402 on a display screen. Thus, an instance of the corresponding class is produced (2304). The production of the instance is executed by calling the object-oriented language processing system 1161. FIGS. 11A to 11B represent the produced instance 181. An initial value which has been stored in the class definition 171 is set into the slot groups 911 to 920. Subsequently, a presentation method (1602 of FIG. 17) of a class definition on an AND gate is called, so that a component figure is displayed on the screen (2305) as shown in FIG. 10A. An operation of representation is shown in FIG. 12. When the presentation method is called under such condition that both the instance and the position coordinate are employed as the arguments (2305), the position coordinate is set to the slots 918 and 919 by executing a formula 1601 contained in the presentation method 409; a figure definition function of the figure definition slot 920 is acquired by executing the formula 1601; and thereafter this figure definition function is called (1602). As a consequence, either a line drawing function, or an arc drawing function is called (1011 and 1012), whereby a figure of an AND gate is represented when another AND gate 125 is drawn, another instance 1182 is similarly produced. Subsequently, several instances will be produced over several classes by repeating the drawing operation.

Next, the instances are coupled with each other by connecting the figures so as to architect a model (116). A detailed sequence of a figure connection 116 will now be described with reference to FIGS. 22 and 10C. First, a connection menu 523 is selected by an operator (2701). Therefore, since a designation of a connection figure is required in a message form 831, an AND gate 813 at an output side and also another AND gate 814 at an input side are sequentially designated by the mouse (2702). As a result, a connection method 1603 is called (2703). In accordance with the connection method 1603, as shown in FIG. 10C, the displayed figures are connected by the line and also as shown in FIG. 11B, these instances are set to the respective slots 914 and 923 for coupling purposes (2704 and 2705). Thus, several pairs of instances will be connected by the lines with each other by repeating the above-described sequences.

Finally, an ending menu 524 is selected by the operator, whereby the modeling 1132 is accomplished (2707). It should be noted that the object-oriented language processing system 1161 performs controls of the presentation method and the connection method.

Next, a simulation is carried out (1133). This simulation is executed in such a manner that a method for a component function is called by the operator (1117). For instance, a method "apply a voltage" 1601 is called with respect to the instance 181. In accordance with the method "apply a voltage" 1601, a voltage and then the method "apply a voltage" 1601 is applied to other coupling components under such a condition that the calculation result is employed as the argument. Thus, the voltage is propagated thereby to continue the simulation. It should also be noted that the object-oriented language processing system 1161 performs the control of the method for the component function.

Thereafter, the result is displayed (1134). Such a result display is carried out by arbitrarily calling the program by way of the simulation 1133, and a presentation slot up date calling operation is executed within this program (1118). When, for example, a voltage is applied to an AND gate, such a calling operation is carried out by which a value of a presentation slot "ignition sign" of this instance is updated by a wide line. This implies that if, for instance, the method "apply a voltage: after" is added to the method "apply a voltage", and also the update calling operation of the presentation slot "ignition sign" is performed, the presentation slot update calling operation may be carried out in conjunction with the execution of the method "apply a voltage" 1601.

In FIG. 13, there is shown an updating operation of a presentation slot. When an "ignition sign update" is called (168), a method of "ignition sign update" 410 and subsequent this method, a reflection method "ignition sign update: after" 411 are called. In the "ignition sign update", a value 935 of a presentation slot "ignition sign" is updated. In the "ignition sign update: after", a figure definition function 918 is called in a similar manner to the presentation method 409 in the display operation shown in FIG. 12. However, when a value 935 of a presentation slot "ignition sign" is referred as an argument of an arc drawing operation in this time, since a new value of a "wide line" is obtained, deformation 126 in which an arc portion has been indicated by the wide line is represented. Such a figure deformation can be performed in conjunction with the simulation by adding the above-described method "apply a voltage: after". In other words, the result of the simulation may be displayed as an animation. Here, it should be understood that both the execution controls of the methods such as the presentation slot update, and also the updating operation of the presentation slot value are carried out by the object-oriented language processing system 1161.

The particular advantages achieved by the present embodiment will now be described.

That is, the program for defining the figure input method of instances, the program for defining the configuration input method among the instances, and also the program for defining the animation description method over the instance figures can be automatically produced by operating only the mouse on the applicable graphic editor, these programs can be stored as the class definition, and can be employed in order to represent the results of the modeling and simulation. As a consequence, the interface of the object-oriented design supporting method can be readily formed, expanded and modified.

Figure 23:
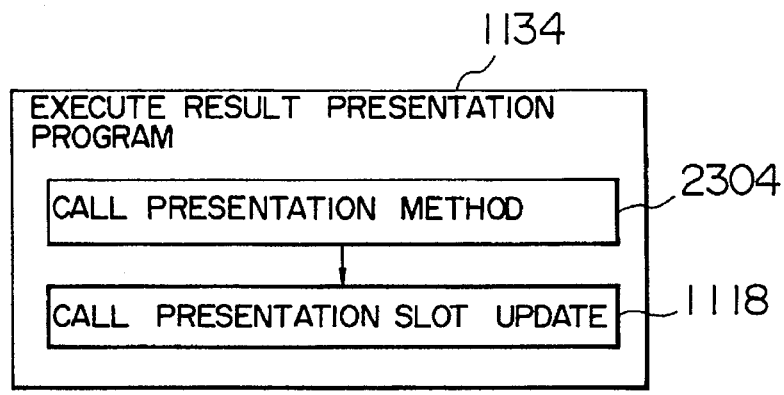
FIG. 23 schematically illustrates a further process for representing results of FIG. 14.

It should be noted that the above-described present slot updating 1118 is not limited to the input figure. For example, as represented in FIG. 23, the presentation method 409 is explicitly called by the result presentation program 1134 and then a figure for an output is displayed (2304), and then this presentation slot updating 1118 may be applied to this outputted figure (2304). If this method is utilized, a portion among the model to be simulated, which is especially picked up, is selected and this picked portion may be displayed as an animation.

In the above-described connection point designation 1113, the connection per se owns an instance and thus a method connected via a connection instance may be produced instead of producing such a connection method for directly connecting the instances of the figures positioned at both ends. In this case, it is so designed that the above-described method may be called at the same time when the connection instance is produced. In accordance with this method, the position and the length of the connection figure are calculated in such a manner that the figures positioned at both ends are designated on the screen and the connection points of this figure are connected with each other, and then are set into the presentation slot. Then, the above-described connection is performed. In this case, the model input 1132 may be achieved by only the figure drawing 1115. As a consequence, the presentation slot is also defined at the connection per se, and therefore it is easy to deform the connection in conjunction with the simulation.

Figure 24A:
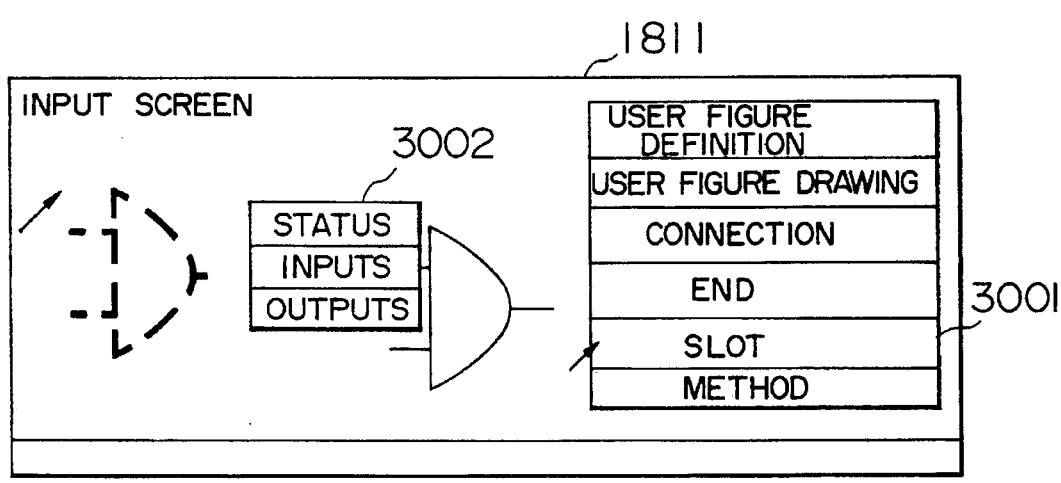
FIG. 24A and 24B schematically represent another process of simulation of FIG. 14.
Figure 24B:
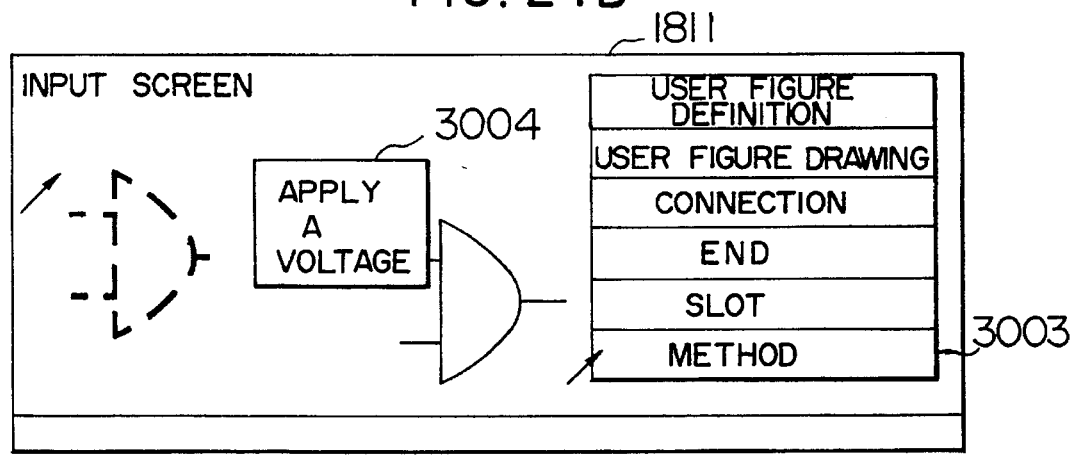
Figure 19:
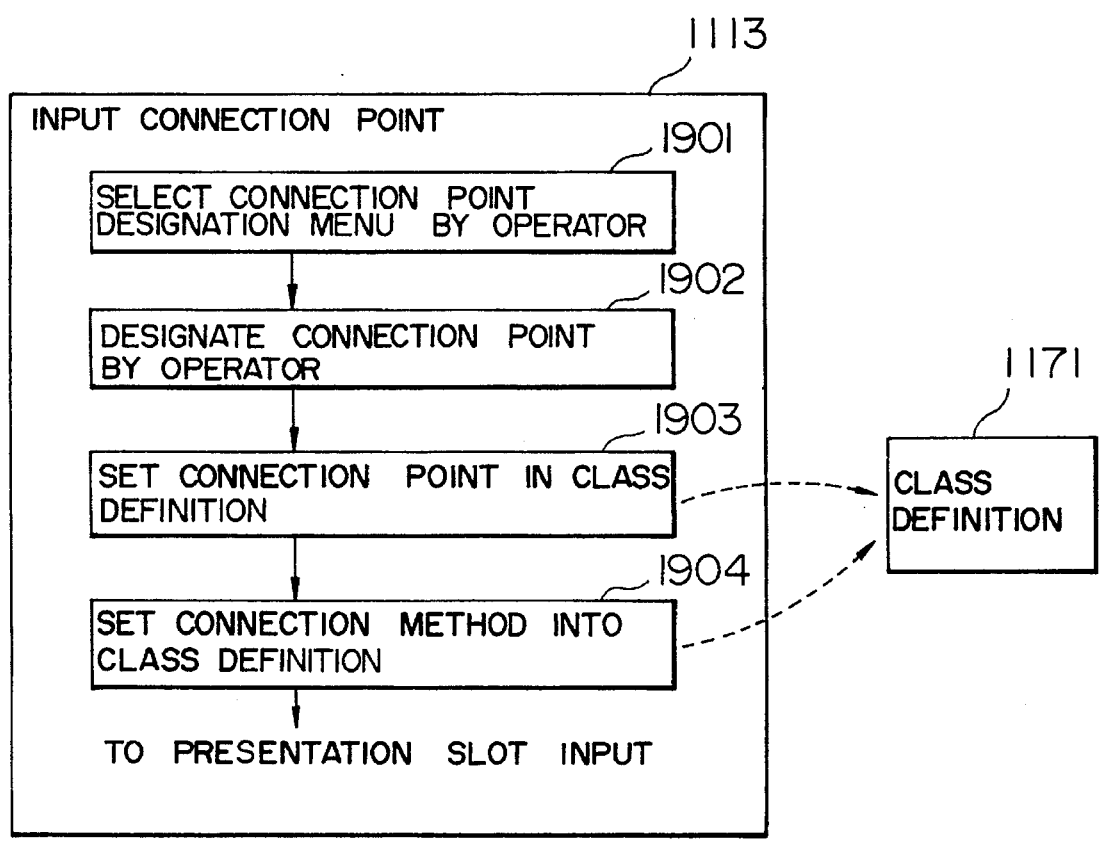
FIG. 19 schematically represents in detail a connection point inputting operation of FIG. 14.
Figure 20:
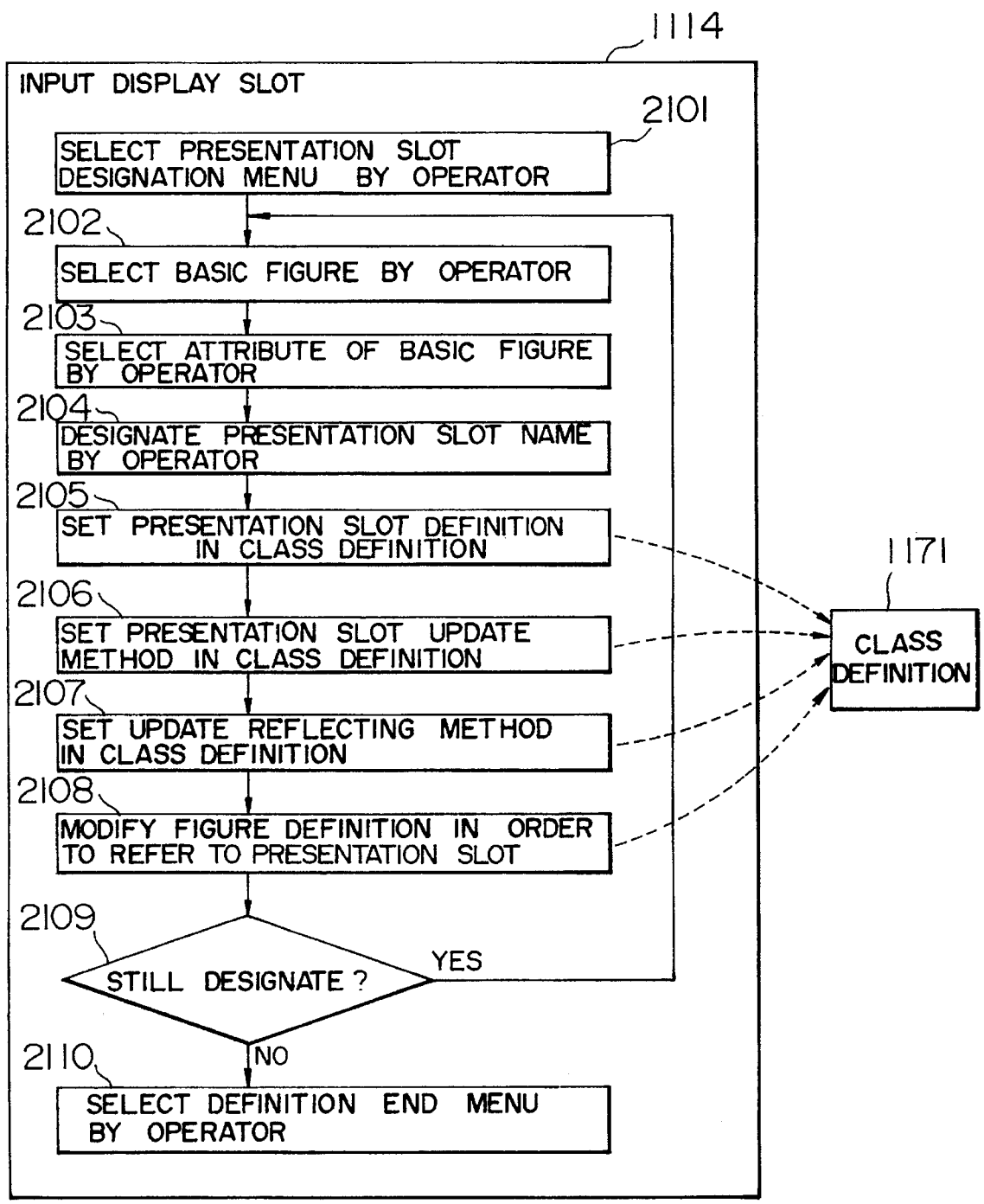
FIG. 20 schematically indicates in detail a presentation slot inputting operation of FIG. 14.
Figure 21:
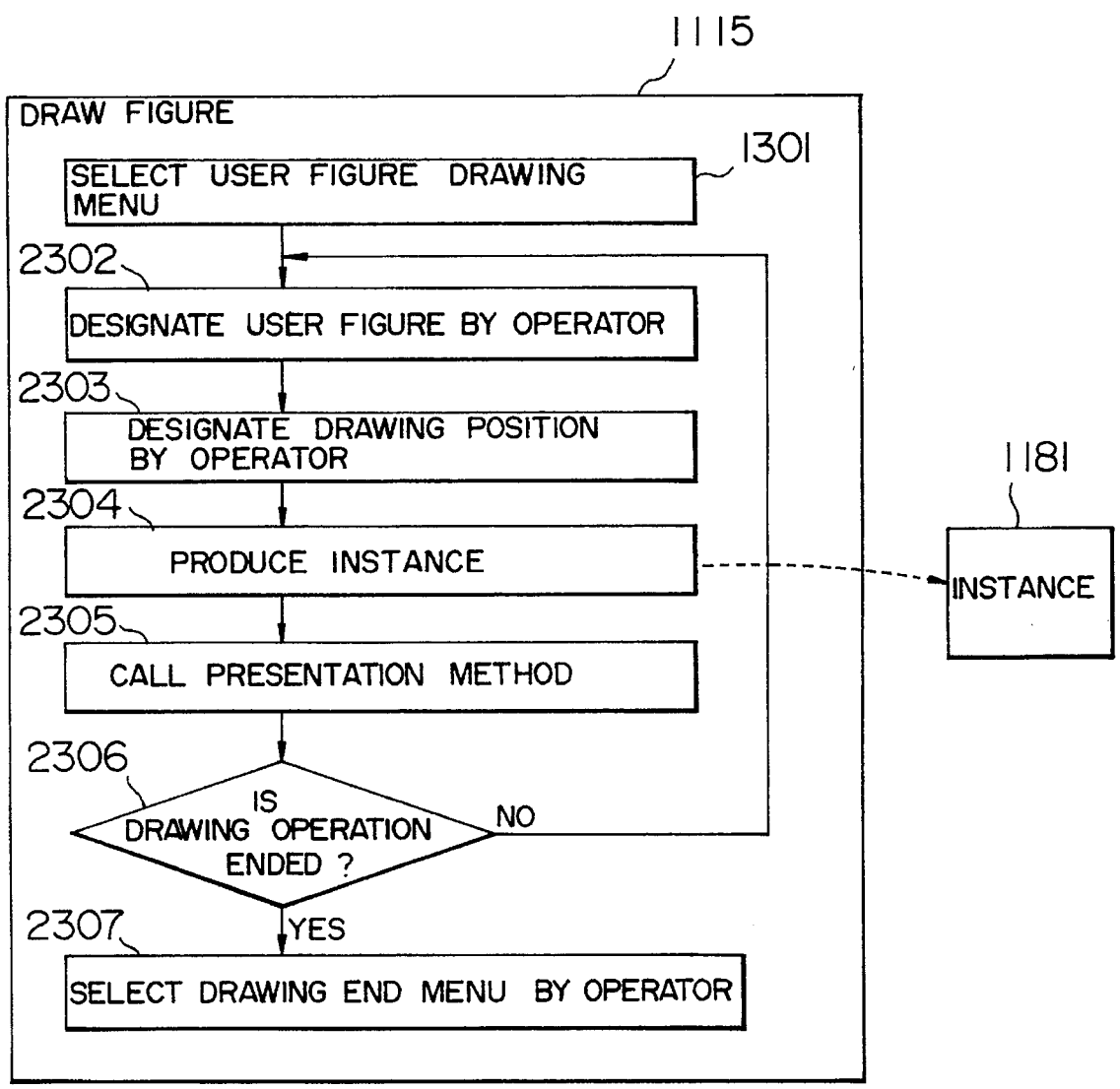
FIG. 21 schematically shows in detail a graphic drawing operation of FIG. 14.
Figure 22:
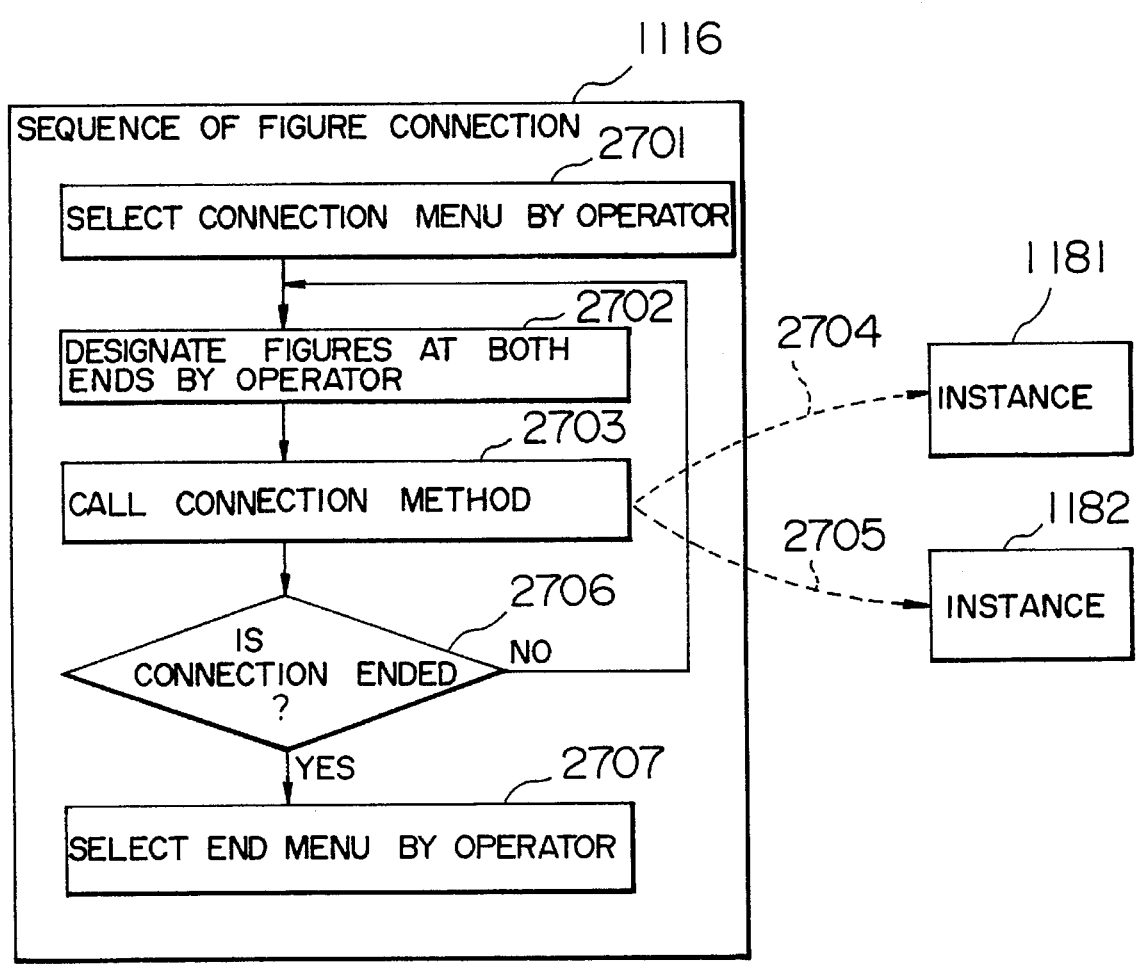
FIG. 22 schematically shows in detail a graphic connection operation of FIG. 14.

As represented in FIG. 24B, in the above-described simulation 1133, a method initiating menu 3003 is set into the input screen 1811 of the applicable graphic editor, and upon designation of an objective figure, a menu 3004 of the method may appear thereon. With such a modification, an interactive function of this method may be more improved than that of the previous method. Moreover, as shown in FIG. 24A, a slot editing menu 3001 is provided, and when an objective figure is designed, a menu 3002 of a slot may appear.

If such a processing unit for moving, duplicating and enlarging a figure is employed in the applicable graphic editor 1162 of the above-described embodiment, an object to be designed may be represented in a more proper figure, by which an designer can readily understand. If such a processing unit for erasing a figure, discarding an instance, and also resolving connection of instances is employed in the applicable graphic editor 1162, an editing operation of an instance group may be supported.

Figure 25:
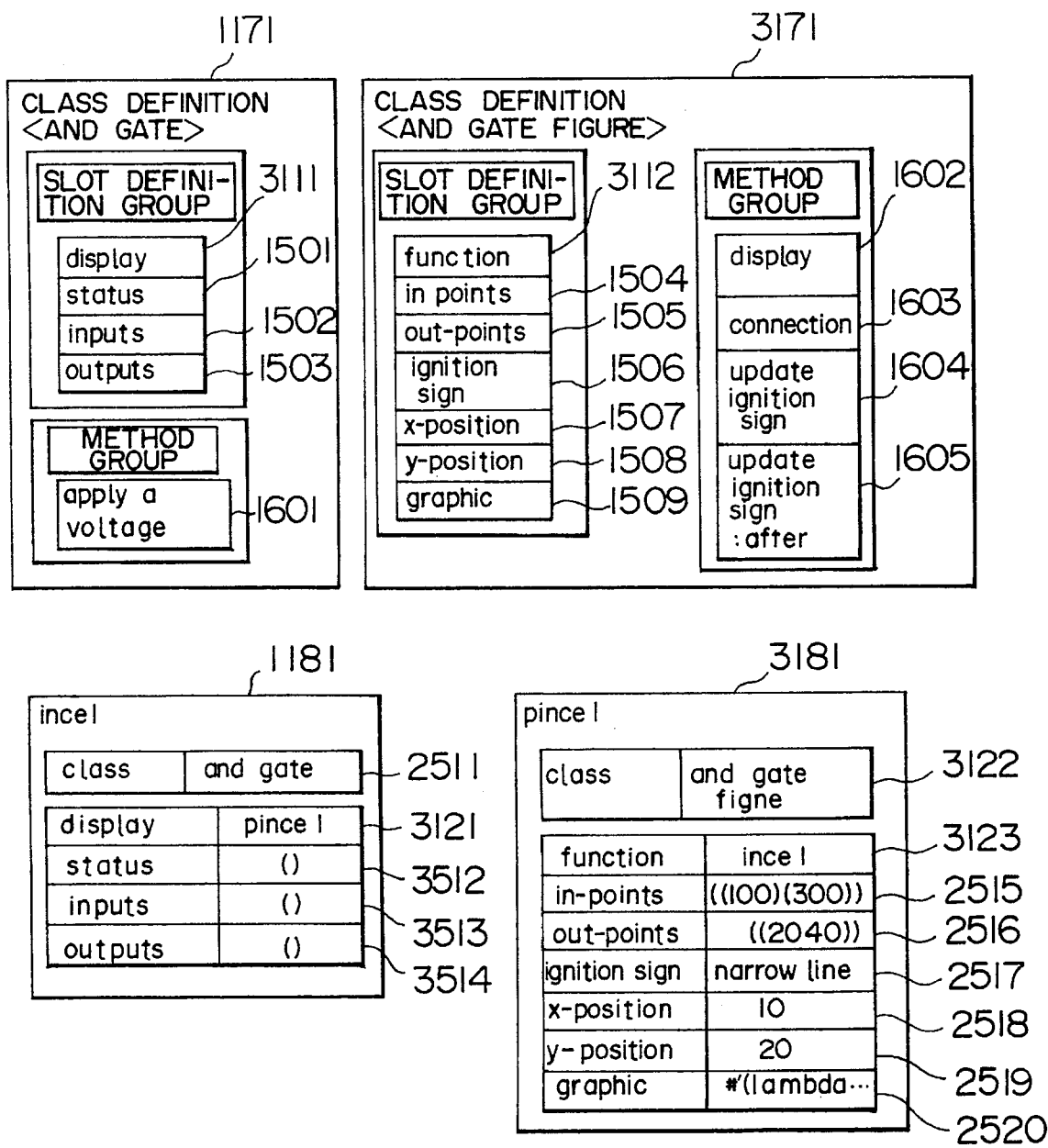
FIG. 25 schematically shows another process for constructing both the class definition and the instance of FIG. 15.

Furthermore, as shown in FIG. 25, the class definition 171 of the above-described embodiment is limited only to the definitions related to the function (1501 to 1503 and 1601), and a presentation class 3171 may be separately provided to which the definitions related to the representation (1504 to 1509 and 1602 to 1605) are stored. In this case, the slot definitions 3111 and 3112 for connecting both of these definitions are provided. When an input is executed, instances 1181 and 3181 are produced respectively, and these instances are set into slots 3121 and 3123, whereby it may be handle as if these instances were a single instance. With such an arrangement, a plurality of presentation formats may be dynamically switched with respect to the definition on a single function class so as to accept this single function class. Since a class inheritance tree may be constructed of only the presentation class, the library about the presentation may be easily maintained in a good condition.

In accordance with the present invention, the method for inputting a figure of an instance, the method for inputting a structure of an instance, and also the method for describing the figure of the instance in the animation form can be automatically set by defining both the figure and some options. In other words, although the conventional data input/output method requires to produce the complex programs for inputting/outputting the figure, such figure input/output operations may be realized by only interactive operation on the display screen in accordance with the present invention. As a consequence, the figure input/output method of the present invention may be simply set, expanded and modified in the interactive mode, and therefore may be easily utilized to accept flexible expansion and modification with respect to the designing object, the system quick development, and the design evaluation method expected to the design supporting system.

What is claimed is:

1. A design supporting process comprising the steps of:

defining a function of a design component as a data type definition information under an object-oriented programing language processing system;

producing a data group of said data type definition information, said producing containing the following substeps of:

drawing a user figure by combining basic figures with each other on a terminal screen of a computer;

storing in a memory both said user figure and a procedure for drawing said user figure on the terminal screen in relation to said data type definition information of the object-oriented programming language;

displaying said user figure on the terminal screen when data of said data type definition information is formed; and producing the data of said data type definition information indicative of the displayed user figure by employing the procedure stored in said memory;

initiating the procedure of said data type definition information to execute a simulation; and, deforming a displayed user figure of said data to display a result of said simulation, said display step containing the following substeps of:

defining any attributes of figure elements among user figures constructed by combining basic figures with each other as a data item of the data type definition information;

producing a procedure for reflecting an update of said data item value on a representation in relation to said data type definition of the object-oriented programming language, and storing said procedure in a memory; and, deforming a displayed user figure of the data by updating said data item value with respect to the data displayed on a terminal screen based on said procedure.

2. A design supporting process as claimed in claim 1, further comprising:

a process step for coupling the data of the data group with each other, said process step containing the steps of:

defining a connection point within a region of a figure;

connecting said connection points of two figures with each other;

simultaneously storing in a memory a procedure used for making a connection between data corresponding to said two figures by a pointer in relation to data type definition information of the object-oriented programming language; and calling said procedure with respect to the data which have been produced on said memory and displayed on the terminal screen, thereby to couple the data group.

3. A design supporting process as claimed in claim 1, further comprising:

a process step for coupling the data of the data group with each other, said process step containing the following substeps of:

defining a connection point within a region with regard to a normal figure;

displaying a connection line in such a manner that a combination of figures positioned at both ends is designated on the terminal screen with regard to figures to be connected with each other, and the connection points of the figures positioned at both ends are connected;

simultaneously and previously preparing the data corresponding to said figures at both ends and a procedure for connecting the data corresponding to said connections by a pointer in relation to the data type definition information of the object-oriented programing language; and coupling the data of the data group with each other by producing the data of said connected figures and simultaneously by calling said procedure.

4. An interface program producing system for automatically producing an interface program of an object-oriented application program by a manipulation on a graphic editor, implemented on a general purpose computer, comprising:

a display device;

means including an applicable graphic editor for interactively setting an input/output procedure in relation to an object-oriented programming language on a display screen of said display device;

means for defining an arbitrary figure as a user figure by combining, interactively between the general purpose computer and an operator, basic figures with each other in said applicable graphic editor, and storing said user figure in a memory in relation to data type information in all object-oriented language processing system;

score means for storing a production program for producing an interface of the corresponding data type information in accordance with said user figure when the user figure is drawn;

means for connecting the drawn figures in accordance with said production program stored in said store means when the operator designates a connection point of the user figure, thereby to produce a procedure for automatically making a connection between data positioned at both ends by way of a pointer in the object-oriented programing language processing system; and simulation means for providing a procedure used to deform a displayed figure by updating a present value of a presentation data item when said operator designates the presentation data item for defining an attribute of the displayed figure on the display screen with regard to the user figure.

5. An interface program producing system as claimed in claim 4, wherein said attribute of the displayed figure includes at least a length, a color and a pattern of a figure element, and a character series.

* * * * *

UNITED STATES PATENT AND TRADEMARK OFFICE
CERTIFICATE OF CORRECTION

PATENT NO. : 5,517,604
DATED : May 14, 1996
INVENTOR(S) : Katsuhiko Yuura, et al.

It is certified that error appears in the above-indentified patent and that said Letters Patent is hereby corrected as shown below:

Claim 4, column 18, line 39, delete "all" and insert therefor --an--.

Claim 4, column 18, line 40, delete "score" and insert therefor --store--.

Signed and Sealed this

Twentieth Day of August, 1996

BRUCE LEHMAN

Attest:

Attesting Officer        Commissioner of Patents and Trademarks